(12) United States Patent
Steiner et al.

(10) Patent No.: US 11,854,631 B2
(45) Date of Patent: Dec. 26, 2023

(54) SYSTEM AND METHOD FOR DYNAMIC COMPENSATION FOR MULTIPLE INTERFERENCE SOURCES IN NON-VOLATILE MEMORY STORAGE DEVICES

(71) Applicant: Kioxia Corporation, Tokyo (JP)

(72) Inventors: Avi Steiner, Tel Aviv (IL); Hanan Weingarten, Tel Aviv (IL); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 93 days.

(21) Appl. No.: 17/407,096

(22) Filed: Aug. 19, 2021

(65) Prior Publication Data

US 2023/0055823 A1    Feb. 23, 2023

(51) Int. Cl.
| | |
|---|---|
| *G11C 16/34* | (2006.01) |
| *G11C 16/26* | (2006.01) |
| *G11C 16/14* | (2006.01) |
| *G11C 16/10* | (2006.01) |

(52) U.S. Cl.
CPC ........ *G11C 16/3495* (2013.01); *G11C 16/102* (2013.01); *G11C 16/14* (2013.01); *G11C 16/26* (2013.01)

(58) Field of Classification Search
CPC ............ G11C 16/0483; G11C 16/3495; G11C 16/349; G11C 16/26; G11C 16/102; G11C 16/3427
See application file for complete search history.

(56) References Cited

U.S. PATENT DOCUMENTS

| | | | |
|---|---|---|---|
| 9,847,141 B1 | 12/2017 | Sagiv et al. | |
| 10,607,709 B1 * | 3/2020 | Steiner | G11C 16/0408 |
| 10,614,897 B1 * | 4/2020 | Steiner | G11C 16/0483 |
| 2015/0364205 A1 | 12/2015 | Chen et al. | |

FOREIGN PATENT DOCUMENTS

| | | |
|---|---|---|
| CN | 106205720 B | 12/2016 |
| TW | I463499 B | 12/2014 |
| TW | I494933 B | 8/2015 |

\* cited by examiner

*Primary Examiner* — Alfredo Bermudez Lozada
(74) *Attorney, Agent, or Firm* — Foley & Lardner LLP

(57) ABSTRACT

A method for dynamically estimating interference compensation thresholds of a page of memory includes computing a histogram and a corresponding threshold based on a plurality of interference states of an interference source; clustering the plurality of interference states to determine an effective number of interference states; and estimating a read threshold to dynamically compensate an interference noise associated with each interference state of the effective number of interference states of the target row based on the histogram.

20 Claims, 18 Drawing Sheets

| Previous word line | | Next word line | | | |
|---|---|---|---|---|---|
| | | $S_p(1)$ | $S_p(2)$ | $S_p(3)$ | $S_p(4)$ |
| | $S_m(1)$ | 1 | 1 | 2 | 3 |
| | $S_m(2)$ | 1 | 2 | 3 | 4 |
| | $S_m(3)$ | 2 | 3 | 4 | 5 |
| | $S_m(4)$ | 3 | 4 | 5 | 5 |

SYSTEM AND METHOD FOR DYNAMIC COMPENSATION FOR MULTIPLE INTERFERENCE SOURCES IN NON-VOLATILE MEMORY STORAGE DEVICES

TECHNICAL FIELD

The present arrangements relate generally to memory devices and more particularly to obtaining improved endurance and average read performance for non-volatile memory storage devices by mitigation of interference of adjacent cells.

BACKGROUND

As the number and types of computing devices continue to expand, so does the demand for memory used by such devices. Memory includes volatile memory (e.g. RAM) and non-volatile memory (e.g., flash memory or NAND-type flash). A non-volatile memory array includes rows and columns (strings) of cells. A cell may include a transistor and be associated with a single bit.

During a read operation, an entire row/page of the non-volatile memory array may be read. This may be done by applying a bias voltage to all rows not being read and a reference threshold voltage to the row that should be read. The bias voltage may allow the transistor of the non-volatile memory array to fully conduct. The cells lying on the row being read will conduct if the threshold voltage is sufficiently high to overcome the trapped charge in the floating gate. A sense amplifier may be connected to each string which measures the current through the string and outputs either a "1" or a "0" depending whether the current passed a certain threshold.

As non-volatile memory cell sizes become smaller, the scaling down of the memory cell sizes may cause an increase in the parasitic capacitance coupling between neighboring cells (floating gate transistors) in a memory block. This phenomenon, called "inter-cell interference" (ICI), may cause errors in memories, leading to degradation in endurance and read performance for non-volatile memory storage devices.

Non-volatile memory storage devices may implement fast programming methods which may induce high levels of interference during the programming to neighboring rows because the neighboring rows are less isolated from the target programmed row.

SUMMARY

The present arrangements relate to methods for obtaining higher endurance and higher average read performance for non-volatile devices by mitigation of interference of adjacent cells.

According to certain aspects, a method for dynamically estimating interference compensation thresholds of a page of memory includes computing a histogram and a corresponding threshold based on a plurality of interference states of an interference source; clustering the plurality of interference states to determine an effective number of interference states; and estimating a read threshold to dynamically compensate an interference noise associated with each interference state of the effective number of interference states of the target row based on the histogram.

According to other aspects, a memory system includes a page of memory having a plurality of rows; and a circuit for performing operation of the page of memory, the circuit being configured to: compute a histogram and a corresponding threshold based on a plurality of interference states of an interference source; cluster the plurality of interference states to determine an effective number of interference states; and estimate a read threshold to dynamically compensation an interference noise associated with each interference state of the effective number of interference states of the target row based on the histogram.

According to yet other aspects, a non-transitory processor-readable medium containing processor-readable instructions such that, when executed by one or more processors, performs a method for dynamically estimating interference compensation thresholds of a page of memory by: computing a histogram and a corresponding threshold based on a plurality of interference states of an interference source; identifying a stress condition based on the histogram; clustering the plurality of interference states to determine an effective number of interference states; and estimating a read threshold to dynamically compensate an interference noise associated with each interference state of the effective number of interference states of the target row based on the histogram

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein.

DETAILED DESCRIPTION

Figure 1:
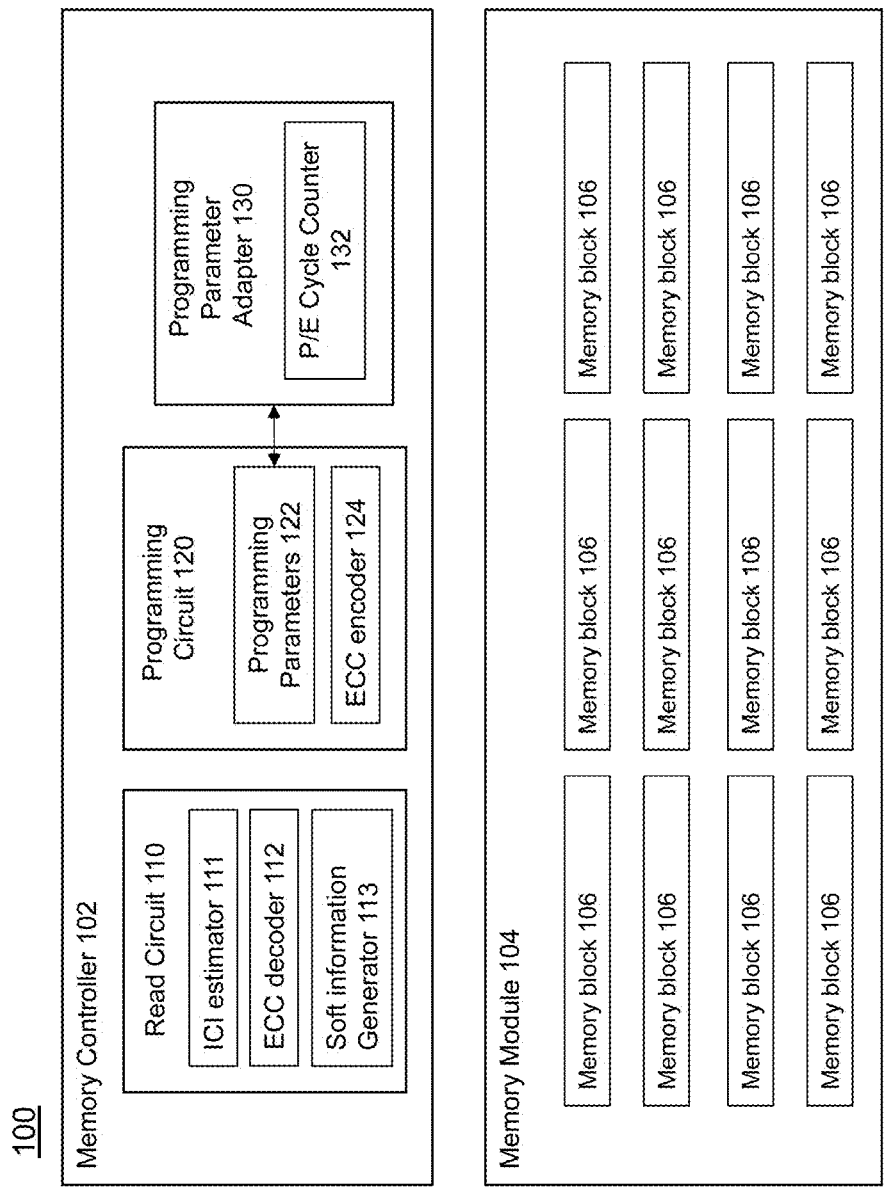
FIG. 1 is a block diagram illustrating a non-volatile storage device according to some arrangements.

According to certain aspects, arrangements in the present disclosure relate to techniques for estimating an optimal (or improved) compensation read threshold for a target page given multiple adjacent interference cells. Multiple neighboring rows may induce multiple interference states on a target row. The target page read-out bit error rate (BER) may be minimized (or reduced) by determining ICI compensation thresholds for each physical row. Classifying various stress conditions may further reduce the BER because stress conditions may induce different interference levels on the target row.

Inherent coupling noise between non-volatile memory cells may occur within planar or three-dimensional (3D) non-volatile memory storage devices. In planar non-volatile memory devices, (1) neighboring cells on the same row and (2) neighboring cells on the same column of an adjacent row may be dominant contributors to ICI. Thus, reliability gains for hard/soft inputs can be obtained by estimating the states of neighboring cells.

The main source of interference may be a programming scheme. For instance, if a row is completely programmed before programming the next row, then the main source of interference may be the programming scheme. For example, during a triple-level cell (TLC) programming, programming of one row may impact a nearby or adjacent row which is already programmed. The cells which are programmed to highest levels may be the source of a stronger interference (than those programmed to levels lower than the highest levels) which may cause unintentional programming of adjacent cells.

However, dense programming non-volatile memory devices (such as NAND storage including quad-level cells (QLC) and five-level cells (PLC)) may include breaking up the programming into multiple steps. For example, the data may be programmed to a given row in a course (initial) setting. Then the adjacent (correlated) row may be programmed coarsely before the target row is programmed in a fine programing stage to final voltage values. This programming method may require more buffering of data and may have lower programming performance, but it may provide a lower BER programming result with reduced interference between correlated cells.

For example, in 3D TLC NAND devices, ICI coupling may be found on adjacent word-lines. Further, stress conditions such as retention or cross-temperature programming and read may have a different level of interference on a target row in 3D NAND devices (or other non-volatile memory storage devices). Accordingly, estimating the interference level, and an optimal compensation dynamically may efficiently decouple ICI.

Systems and methods are provided for obtaining improved endurance and average read performance for non-volatile memory storage devices by mitigation of interference (i.e., ICI) of adjacent cells. The improved endurance and average read performance may extend the uses of the non-volatile memory storage by increasing device reliability and efficiency. In some embodiments, dynamic ICI estimation may be performed without identifying stress conditions. In other embodiments, (e.g., depending on the device and ICI characteristics), stress conditions may be estimated and used to determine whether ICI compensation should be performed.

In some arrangements, read thresholds for ICI compensation may be estimated. The read thresholds may be used for a group of bits around a specific threshold for every ICI state. Read operations, or mock-read operations, may be performed to estimate read thresholds for ICI compensation. Several read operations using different thresholds on interfering rows may need to be performed to determine multiple ICI state information. The read operations add overhead, increasing latency. The added latency may exceed hard decoding timing requirements.

Accordingly, in some arrangements, soft sampling may be employed. Performing soft sampling may be advantageous over hard sampling because soft sampling may involve a higher number of additional reads than hard sampling. Soft sampling involves performing multiple reads, where each read operation uses a different one of the read thresholds. Estimating the read thresholds for ICI compensation using soft sampling improves the quality of service of soft sampling by increasing the estimation accuracy. Performing soft sampling to estimate read thresholds for ICI compensation may be more accurate compared to mock read threshold based estimations because soft sampling uses more information around each target threshold. The estimation accuracy of soft sampling may also be improved by estimating optimal compensation thresholds for each ICI state.

The reliability of the soft information (e.g., the soft label) may be a log-likelihood ratio (LLR) value mapped from a hard read value and an interference value. For example, the conditional LLR value of bit b depends on the interference state I, as shown in Expression 1:

$$LLR(b|I) = \log\left(\frac{P(b=1|I)}{P(b=0|I)}\right) \quad (1)$$

The systems and methods in the present disclosure may apply ICI compensation after soft sampling to modify the labels of the soft sampling without having to resample the soft input using the estimation results for multiple interference states. Soft sampling and decoding may be described in more detail in U.S. application Ser. No. 16/843,774, titled "DECODING SCHEME FOR ERROR CORRECTION CODE STRUCTURE IN DATA STORAGE DEVICES," filed on Apr. 8, 2020 by Avi Steiner and Hanan Weingarten, and U.S. Pat. No. 10,614,897, titled "SYSTEM AND METHOD FOR HIGH PERFORMANCE SEQUENTIAL READ BY DECOUPLING OF INTER-CELL INTERFERENCE FOR NON-VOLATILE MEMORIES," filed on Sep. 13, 2018, by Avi Steiner, which are both incorporated by reference herein in their entireties. The applications incorporated by reference disclose methods for interference compensation. However, as disclosed herein, interference compensation is improved by dynamically estimating a dynamic compensation for multiple interference states from multiple interference sources.

In some arrangements, the systems and methods for mitigation of interference of adjacent cells as described in the present disclosure can be implemented on a non-volatile memory storage controller (e.g., the memory controller 102 in FIG. 1). In some arrangements, the signal processing operations for mitigation of interference of adjacent cells as described in the present disclosure can be implemented by hardware or software running on a non-volatile memory storage controller (e.g., the memory controller 102 in FIG. 1). Implementing the signal processing operations on the non-volatile memory storage controller hardware (or firmware) may result in low complexity processing. In some arrangements, the signal processing operations for mitigation of interference of adjacent cells as described in the present disclosure can be used for implementation in storage controllers, e.g., solid state drive (SSD) controllers, universal flash storage (UFS) controllers, secure digital (SD) controllers, and the like.

FIG. 1 is a block diagram illustrating a non-volatile storage device 100 according to some arrangements. In some arrangements, the non-volatile storage device may be a flash memory system which can perform any of the methods described in the present disclosure. Examples of the device 100 include but are not limited to, a solid state drive (SSD), a non-volatile dual in-line memory module (NVDIMM), a Universal Flash Storage (UFS), a Secure Digital (SD) device, and so on.

In some arrangements, a different device (not shown) may communicate with the device 100 over a suitable wired or wireless communication link to execute some or all of the methods described herein. The device 100 may include a memory module or memory device 104 and a memory controller 102 for performing operations of the plurality of cells.

The memory controller 102 may include a read circuit 110, a programming circuit (e.g. a program DSP) 120 and a programming parameter adapter 130. In some arrangements, the read circuit 110 may include an ICI estimator 111, an ECC decoder 112 and/or a soft information generator 113. In some arrangements, the programming circuit 120 may include an ECC encoder 124 and programming parameters 122. In some arrangements, the programming parameter adapter 130 may include a program/erase cycle counter 132. Examples of the memory controller 102 include but are not limited to, an SSD controller (e.g., a client SSD controller, a datacenter SSD controller, an enterprise SSD controller, and so on), a UFS controller, or an SD controller, and the like. Arrangements of memory controller 102 can include additional or fewer components such as those shown in FIG. 1.

The memory controller 102 can combine raw data storage in the plurality of memory blocks 106 such that the memory blocks 106 function as a single storage. The memory controller 102 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the memory module 104 or in any other suitable computer readable storage medium.

The memory controller 102 includes suitable processing and memory capabilities for executing functions described herein, among other functions. As described, the memory controller 102 manages various features for the memory block 106 in the memory module 104 including, but not limited to, I/O handling, reading, writing/programming, erasing, monitoring, logging, error handling, garbage collection, wear leveling, logical to physical address mapping, data protection (encryption/decryption), and the like.

In some arrangements, the ICI estimator 111 of the read circuit 110 may be configured to estimate an interference state based on a result of a read operation on a first neighboring cell of a first cell (i.e., a target cell) among the plurality of cells. In some arrangements, a statistical dependency modelling of main interference sources and their impact can be characterized. For example, the ICI estimator 111 may be configured to perform a statistical dependency modelling of interference sources and their impact.

In some arrangements, the statistical dependency modelling of main interference sources and their impact can be characterized offline. For example, statistical dependency modelling may be performed offline when different programming schemes of different non-volatile memory storage devices increases the difficulty of performing statistical dependency modelling online. For example, the programming scheme of one generation of non-volatile memory storage devices may be different from that of another generation of non-volatile memory storage devices.

In some arrangements, the ICI estimator 111 may perform a statistical dependency modelling of interference sources and their impact offline. In some arrangements, to perform such statistical dependency modelling offline for a target non-volatile memory storage device, the ICI estimator 111 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), at least information on the programming scheme of the target non-volatile memory storage device so that it can accurately model the interference sources and their impact in the target non-volatile memory storage device.

In estimating the interference state, the ICI estimator 111 may be further configured to estimate a level at which the first neighboring cell is programmed. For example, the ICI estimator 111 may estimate, based on a result of a read operation on the first neighboring cell, a level at which the first neighboring cell is programmed. The ICI estimator 111 may then estimate an interference state of the first neighboring cell based on the estimated programmed level of the first neighboring cell. In some arrangements, the interference state of a neighboring cell is an estimated programmed level of the neighboring cell.

In estimating the interference state, the ICI estimator 111 may be further configured to obtain the result of the read operation on the first neighboring cell from pre-fetch of a next page read or by saving a previous read result. For example, in estimating the interference state for a target cell in a target page, the ICI estimator 111 may obtain a read result of a neighboring cell (of the target cell) in a next page that is to be read next to the target page, by pre-fetching the read result of the next page. In some arrangements, the ICI estimator 111 may obtain a read result of a neighboring cell (of the target cell) in a previous page that has been read prior to the target page, by saving and reusing the read result of the previous page. In this manner, in some arrangements, the ICI estimator 111 may be configured to estimate interference states for decoding results of read operations on the plurality of cells by reading the rows of the plurality of cells sequentially and only once. In some arrangements, the ICI estimator 111 may estimate the inference state of a neighboring cell from a distribution of state (or level) programmed in the neighboring cell.

In some arrangements, the ICI estimator 111 may analyze and model the interference state for a target cell as a function of one or more cells adjacent to the target cell. In some arrangements, to analyze the contribution of interference of each neighboring cell, a single neighboring row state estimation may be performed. For example, the ICI estimator 111 can estimate the interference state of a neighboring row from a hard read before decoding. In some arrangements, the ICI estimator 111 can estimate the interference state of a neighboring row post decoding as true data.

In some arrangements, once interference sources and their impact are modeled or identified, simple signal processing operations can be performed to compensate for or decouple the interference. For example, sampling results of a target page can be post-processed to compensate for or decouple the interference. In some arrangements, reliability information for reading or decoding of a target page can be provided. For example, the soft information generator 113 of the read circuit 110 may be configured to generate reliability information (e.g., calculating a probability of error) and provide soft information based on the reliability information. In some arrangements, the soft information generator 113 of the read circuit 110 may be configured to generate soft information based on the estimated interference state and a read value from the first cell. Arrangements of generating soft information and using the soft information generator 113 are further described herein with reference to FIGS. 12-14.

The ECC decoder 112 may be configured to decode soft information as a result of read operations on cells. Additionally or alternatively, the ECC decoder 112 may correct errors, improving accuracy and stress relief of a non-volatile memory storage controller.

The memory controller 102 may also include a programming circuit 120. The programming circuit may include an ECC encoder 124 and programming parameters 122. For example, the ECC encoder 124 may determine the soft labels from the soft samples. The memory controller 102 may also include programming parameter adapter 130. The adapter 130 may adapt the programming parameters 122 in the programming circuit 120. The adapter 130 in this example may include a Program/Erase (P/E) cycle counter 132. Although shown separately for ease of illustration, some or all of the adapter 130 may be incorporated in the programming circuit 120.

The memory module 104 may be an array of memory blocks 106. The memory blocks may include non-volatile memory such as NAND flash memory, dynamic random access memory (DRAM), magnetic random access memory (MRAM), phase change memory (PCM), ferro-electric RAM (FeRAM), and so on. In some arrangements, the memory module 104 may have a plurality of cells. In some arrangements, each of the memory blocks 106 may have a plurality of cells. In some arrangements, the cell memory (e.g., the memory module 104 or a memory block 106) may include rows and columns of the plurality of cells. In some arrangements, a memory block 106 may include a plurality of pages (not shown) and a page may be defined as cells linked with the same word line, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Additionally or alternatively, the module 104 can comprise or be implemented using a plurality of dies, each of the dies containing a plurality of the blocks 106.

Figure 2:
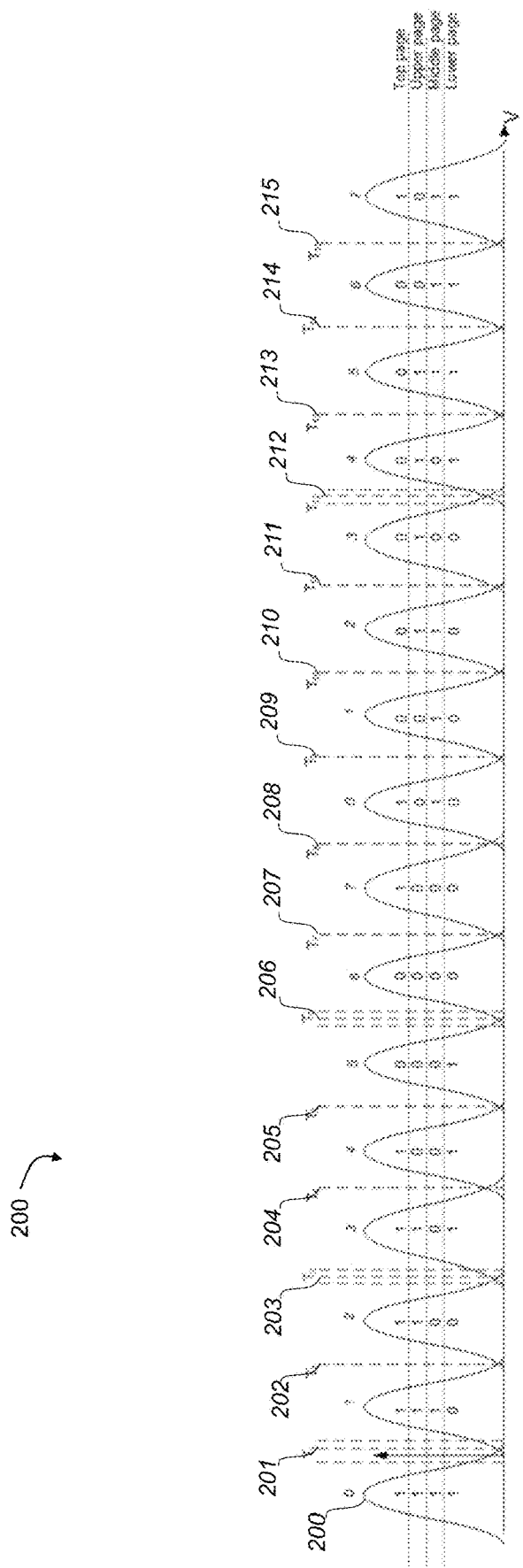
FIG. 2 is a diagram of histograms with VT distributions of a four bits per cell (bpc) non-volatile memory storage device, according to some arrangements.

FIG. 2 is a diagram of histograms 200 with VT distributions of a four bits per cell (bpc) non-volatile memory storage device (e.g., a flash memory device such as a QLC with 16 programmable states), according to some arrangements. Depicted are 16 lobes (distributions, or histograms) corresponding to the 16 different bit combinations of four bits represented by the charge state of the cell. A lower page read requires using thresholds $T_1$ 201, $T_3$ 203, $T_6$ 206 and $T_{12}$ 212 to separate the histograms into those with LSBs of 0 into those of LSBs of 1. Read thresholds $T_2$ 202, $T_8$ 208, $T_{11}$ 211, and $T_{13}$ 213 are used to separate the histograms into those with LSBs of 0 and those with LSBs of 1 for reading middle pages, read thresholds $T_4$ 204, $T_{10}$ 210, and $T_{14}$ 214 are used to separate the histograms into those with LSBs of 0 and those with LSBs of 1 for reading upper pages, and read thresholds $T_5$ 205, $T_7$ 207, $T_9$ 209 and $T_{15}$ 215 are used to separate the histograms into those with LSBs of 0 and those with LSBs of 1 for reading top pages. The lower histogram 200 may be considered the erase level.

As described herein, when read operations are performed on a target row, interference may be induced. In some implementations, a fixed ICI compensation may be added to read thresholds. However, the fixed compensation may not be effective in improving BER because depending on the ICI state, stress condition of the device, and the read threshold, the degree of the added ICI compensation varies. For example, while the effect of an induced ICI state may be known (e.g., shifting the threshold higher or lower than the ideal/optimum ICI compensation threshold associated with no ICI state threshold), the degree of the shift in the direction may be unknown.

Figure 3:
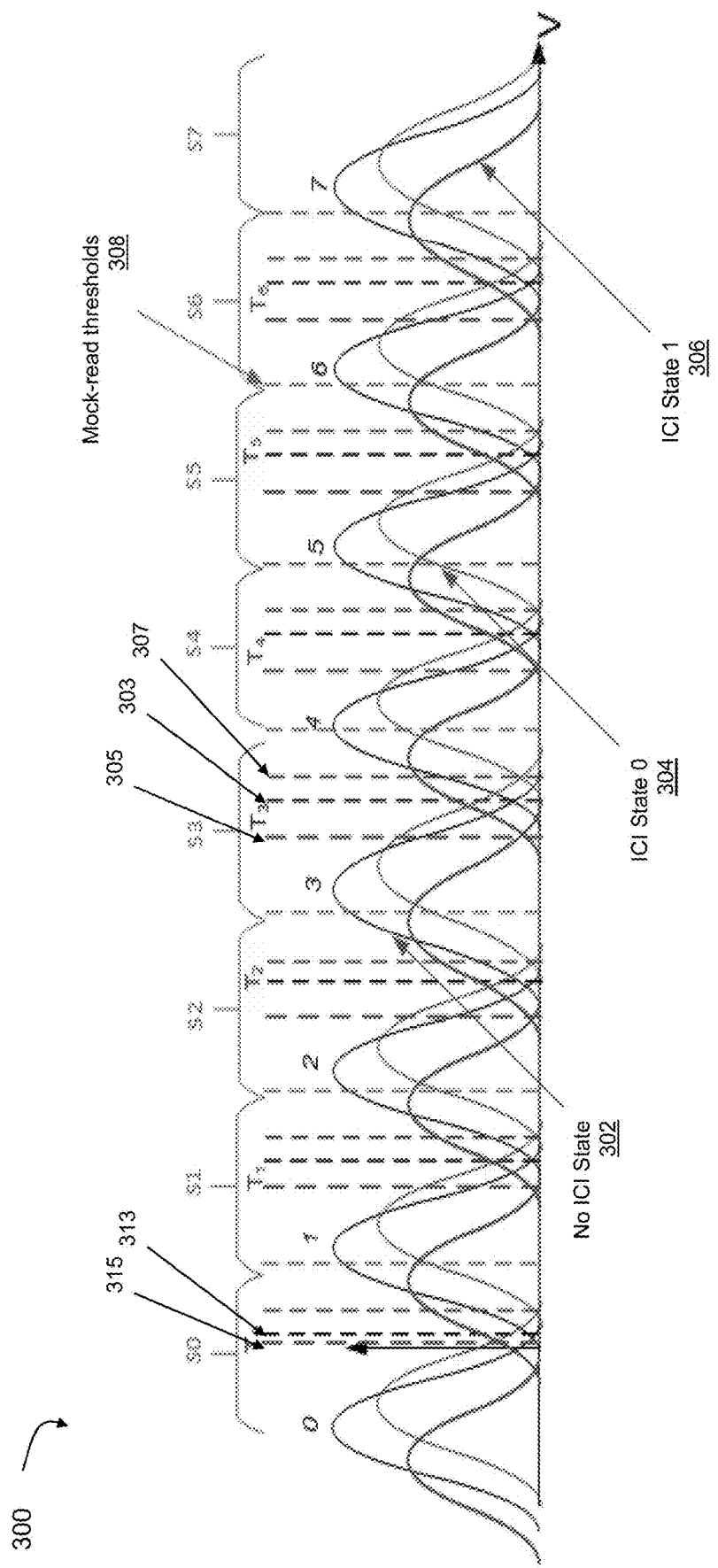
FIG. 3 is a diagram of histograms with VT distributions for each programmed state of a non-volatile memory storage device, according to some arrangements.

FIG. 3 is a diagram 300 of histograms with VT distributions for each programmed state of a non-volatile memory storage device (e.g., a TLC NAND row), according to some arrangements. The VT distributions (histograms) are conditional information states. The histograms may be an example of the histograms and VT distributions determined in the case of one-shot programming with one main source of interference (e.g., interference introduced during programming). A single read using a single threshold (e.g., a single state read) is the minimal overhead that may be added to obtain interference information in a read-flow.

FIG. 3 may be characterized offline, however no single shift value for compensation will provide the optimal ICI compensation given the interference information, as described further herein. Accordingly, each ICI compensation threshold is offset by a unique voltage from an ideal read threshold (e.g., a read threshold unaffected by ICI).

Histogram 302 identifies the target row to be read. Each of the black dashed thresholds 303 and 313 identify the optimal read threshold (e.g., an ideal read threshold) which provide the minimal output BER per threshold when there is no ICI information available (e.g., an ideal histogram). The single read of the neighboring interfering row results in two induced histograms (e.g., histogram 304 and histogram 306) for the same target row. Histogram 304 and histogram 306 are conditional histograms. The sum of histogram 304 and histogram 306 results in histogram 302.

Histogram 304 corresponds to ICI state 0. Histogram 304 may be obtained by computing the VT distribution for the cells of the target row which correspond to the read result of "0" on the neighboring interfering row. Histogram 304 is shifted to higher voltages (e.g., shifted right from the no ICI state histogram 302) because histogram 304 is associated with the high program disturb of the neighboring row.

Histogram 306 corresponds to ICI state 1. Histogram 306 may be obtained by computing the voltage threshold distribution for the cells of the target row which correspond to the read result of "1" on the neighboring interfering row. Histogram 306 is shifted to lower voltages (e.g., shifted left from the no ICI state histogram 302) because histogram 306 is associated with the lower program disturb from the neighboring row.

Expression 2 below shows that the sum of the BERs associated with the conditional histograms sum to the BER associated without any ICI. The two conditional histograms (e.g., histogram 304 and histogram 306) sum up to the histogram associated with no ICI state (e.g., histogram 302) such that the total BER with ICI compensation is lower than the no ICI state BER.

$$BERnoICI > BERICI\_0 + BERICI\_1 \qquad (2)$$

BERnoICI denotes the read-out BER associated with the no ICI state (e.g., histogram 302), BERICI_0 denotes the read-out BER associated with ICI state 0 (e.g., histogram 304), and BERICI_1 denotes the read-out BER associated with ICI state 1 (e.g., histogram 306).

As compared to the optimal read threshold associated with no ICI state (e.g., threshold 303), each ICI state and associated histograms are associated with different optimal thresholds. Accordingly, a fixed ICI compensation associated with each ICI state may not be efficient in reducing BER.

To demonstrate the need for different ICI compensations for different ICI states, attention is drawn to the thresholds associated with each ICI state. The blue dashed threshold 305 (and threshold 315) is associated with the ICI state 0 and the red dashed threshold 307 is associated with the ICI state 1. As shown, the effect of the ICI is a shift in a known direction. However the conditional ICI distributions (e.g., histogram 304 and histogram 306) have thresholds with varying shifts with respect to the optimal threshold for the original row without ICI information (e.g., histogram 302).

For example, the blue dashed thresholds 305 and 315 are both associated with ICI state 1. Both thresholds are shifted left from threshold 303 and 313 respectively (the threshold representing the optimal threshold with no ICI state). However, the degree of the shift is different, resulting in threshold 305 being different from threshold 315.

As shown, read operations may be performed on the target row to facilitate the computation of the optimal ICI compensation threshold. Three page reads obtain eight states of the TLC (e.g., S0 to S7). Mock reads are superimposed on the set of VT distributions (histograms). The mock reads 308 are used to sense the histograms (e.g., histogram 302 associated with no ICI state, histogram 304 associated with ICI state 0, and histogram 305 associated with ICI state 1) of the target row to facilitate the optimal ICI compensation thresholds.

Figure 4:
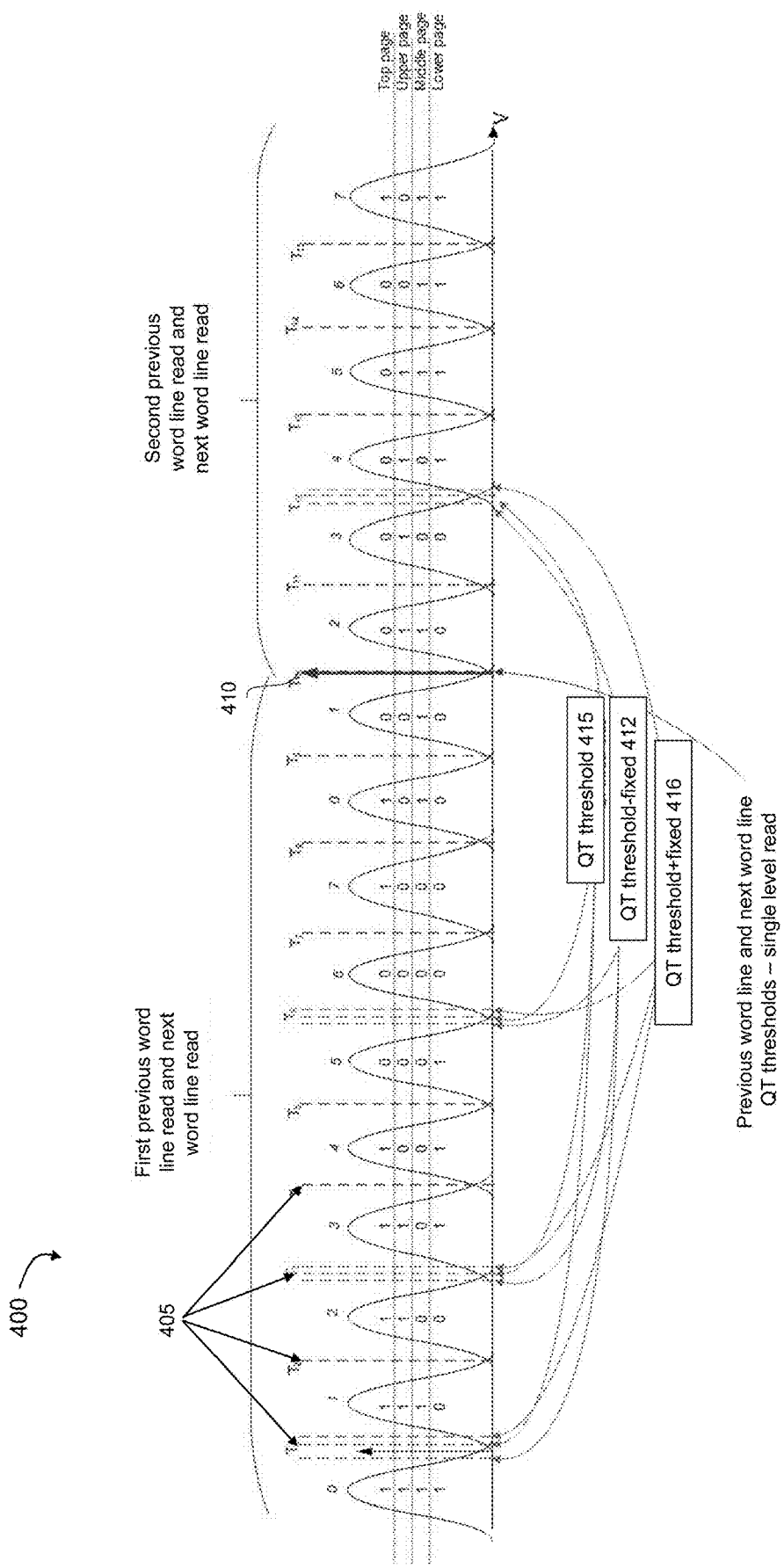
FIG. 4 is a diagram of histograms with VT distributions for each programmed state (e.g., four ICI states) of a non-volatile memory storage device, according to some arrangements.

FIG. 4 is a diagram 400 of histograms with VT distributions for each programmed state (e.g., four ICI states) of an example non-volatile memory storage device (e.g., a QLC NAND row), according to some arrangements. The row indicated in FIG. 4 may be the target row to be read. As shown, at 410, there is a single read of the neighboring N interfering rows. There may be $2^n$ induced histograms for the same target row.

Thresholds 405 may be an example of the optimal read thresholds (e.g., the ideal read thresholds without ICI information). The thresholds 405 provide the minimal output BER per threshold when there is no ICI information available. Thresholds 412 and 416 may be offset from threshold 415. For example, thresholds 412 and 416 may be a value offset of thresholds 415 based on a fixed step size of a digital-to-analog converter (DAC).

Figure 5:
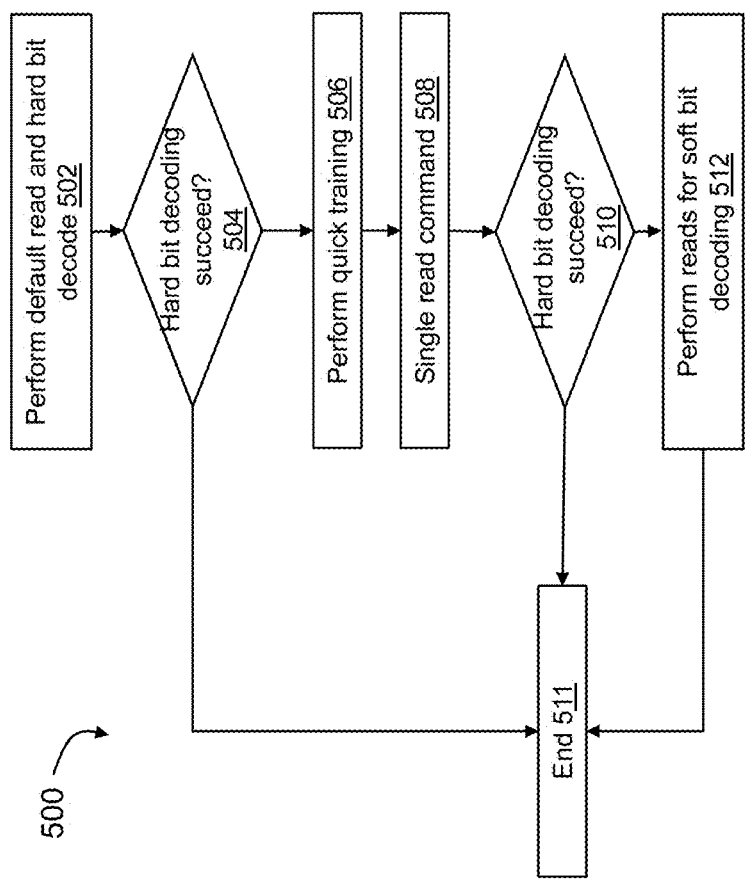
FIG. 5 is a flow chart of a read flow using fixed ICI compensation thresholds, according to some arrangements.

FIG. 5 is a flow chart of a read flow 500 using fixed ICI compensation thresholds, according to some arrangements. The read flow 500 applies a fixed ICI compensation for all stress conditions. The read flow 500 provides example read operations using interference information that may be performed to determine fixed ICI compensation thresholds. The maximum number of read operations for the read flow described in FIG. 5 is nine.

In block 502, a single read command may be performed on a target row. The read type may be a full page read. The read command may be performed with default thresholds for the target row as usually performed when minimal (or no) prior information is available on the target page/block. If prior information is available, the first read thresholds may be based on history and/or tracking information instead of the default values. For example, the read thresholds may be the read thresholds associated with the previous read command. In some arrangements, the read command may use the last threshold if the time associated with the read command is less than 70 microseconds. In some arrangements, a hard decoding attempt may be performed on the read results.

In block 504, it may be determined whether the hard decoding of the read result of the target page succeeded. If the hard decoding failed (e.g., due to high error rate), the process may proceed to block 506. For example, the decoded BER may not satisfy a threshold (e.g., an accuracy threshold). If the hard decoding succeeded, the process may end at block 511.

In block 506, quick training (QT) may be performed. QT may be performed using a linear estimator, as discussed herein. The QT operation may perform a set of read operations (e.g., five single level cell (SLC) reads) using mock thresholds. Histograms may be computed in order to estimate the read thresholds for the next read. The computed histogram may also be used for the estimation of stress conditions as discussed further herein. In some non-volatile memory storage devices (e.g., QLC NAND), there may be no need for ICI compensation for stress conditions.

In block 508, a single full page read command may be performed using the estimated thresholds from block 506. Hard bit decoding may be attempted of the read result on the target page. Block 510 may be similar to block 504. In block 510, it may be determined whether the hard decoding of the read result of the target page succeeded. If the hard decoding failed, the process may proceed to block 512. If the hard decoding succeeded, the process may end at block 511.

In block 512, two additional full page read (or other reads) may be performed to obtain soft bit information such that soft bit decoding may be performed (e.g., the soft decoding read flow 1400 in FIG. 4 may use the soft information generator 113 of FIG. 1). For example, two read operations may be performed and two ICI may be compensated using fixed shifts relative to the estimated thresholds from block 506. The soft bit information may be combined with the read information from block 508 to provide labels for the decoder (e.g., the ECC decoder 112 in FIG. 1)

Figure 6:
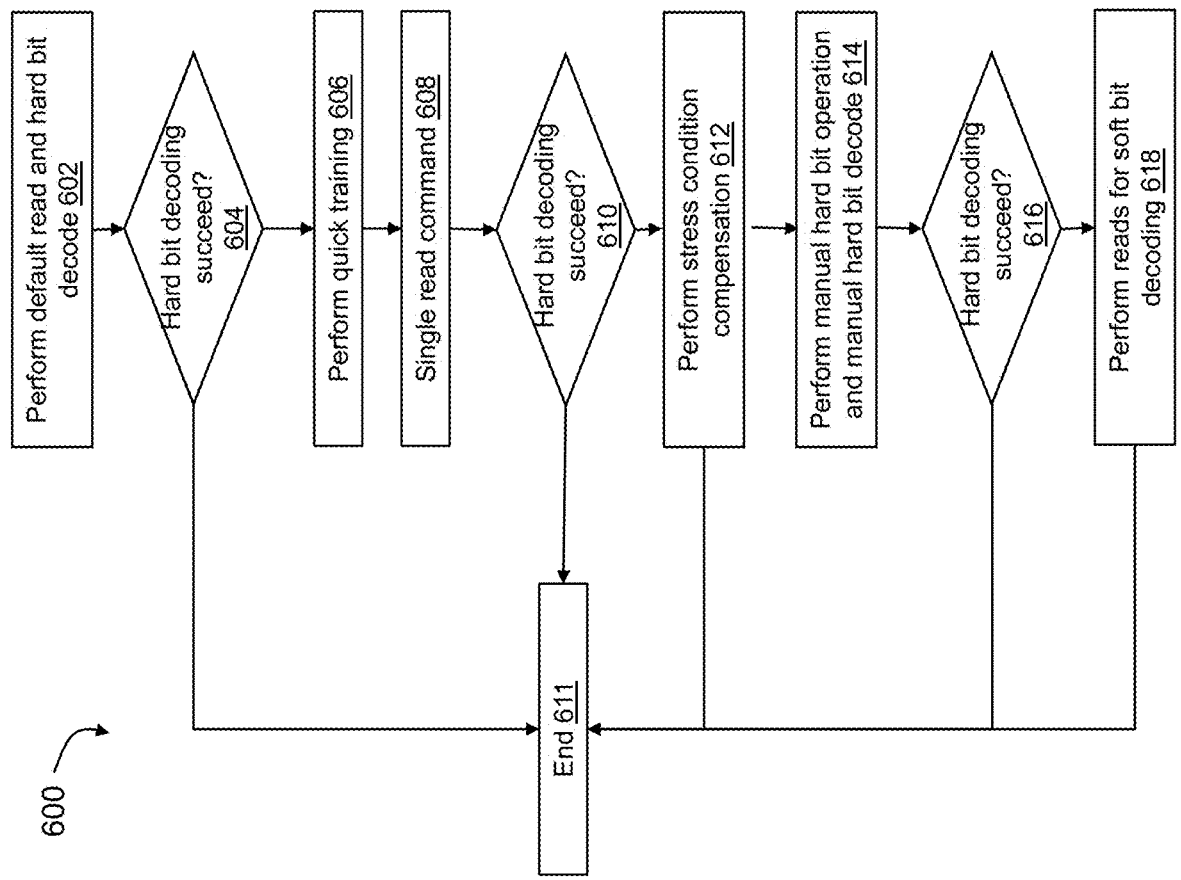
FIG. 6 is a flow chart of a read flow using stress condition classification to perform dynamic ICI compensation with adapted read thresholds to a target page under the current stress conditions, according to some arrangements.

FIG. 6 is a flow chart of a read flow 600 using stress condition classification to perform dynamic ICI compensation with adapted read thresholds to a target page under the current stress conditions, according to some arrangements. As described herein, the benefits of using dynamic threshold estimation and dynamic stress class estimation include reducing the BER and reducing the probability of having to perform soft decoding. Further, performing stress condition estimation adds a minimal amount of reads. For instance, four reads are added to the flow chart of the read flow 600 as compared to the flow chart of read flow 500.

Block 602 may be similar to block 502 in FIG. 5. In block 602, a single read command may be performed on a target row. The read type may be a full page read. The read command may be performed with default thresholds for the target row as usually performed when minimal (or no) prior information is available on the target page/block. If prior information is available, the first read thresholds may be based on history and/or tracking information instead of the default values. For example, the read thresholds may be the read thresholds associated with the previous read command. In some arrangements, the read command may use the last threshold if the time associated with the read command is less than 70 microseconds. In some arrangements, a hard decoding attempt may be performed on the read results.

Block 604 may be similar to block 504 in FIG. 5. In block 604, it may be determined whether the hard decoding of the read result of the target page succeeded. If the hard decoding failed (e.g., due to high error rate), the process may proceed to block 606. For example, the decoded BER may not satisfy a threshold (e.g., an accuracy threshold). If the hard decoding succeeded, the process may end at block 611.

Over time, the hard decoding may be more likely to succeed (and therefore proceed to the end at block 611) because the default thresholds (or the previous thresholds) track the stress condition and/or other changes to the non-volatile memory storage device. Stress conditions may dynamically change according to temperature and/or time. However, in some cases, the temperature may change slowly such that the stress condition and associated compensated threshold may track, resulting in a desirable BER.

For example, at time t=0, the hard decoding may fail and the ICI compensation thresholds may be adjusted as described herein. At time t=1, the hard decoding may likely succeed because the adjusted thresholds determined from the first execution of blocks 602-618 may still be relevant/updated at time t=1. Accordingly, the quality of service may improve based on the self adjusting process of the non-volatile memory storage device. The probability of soft decoding decreases (e.g., the probability of reaching block 618) because the previously updated thresholds track the conditions of the non-volatile memory storage device such that hard bit decoding is more likely to succeed more often. Updating the thresholds such that hard bit decoding is more likely to succeed (e.g., at blocks 604, 610, and 616) frees the processing power and resources of the non-volatile memory storage device. Accordingly, the overall latency resulting from performing reads is decreased because the first read (e.g., performed at block 602) and associated read thresholds are likely relevant at a later time.

In block 606, QT may be performed. The QT operation may perform a set of read operations (e.g., five single level cell (SLC) reads) using mock thresholds. Histograms may be computed to estimate the read thresholds for the next read. The reads performed with the mock thresholds may be saved on the buffers so that they be used later on in read flow.

The computed histogram may also be used for the estimation of stress conditions. Before dynamic ICI compensation is performed, a classification of the stress condition may be performed. An ICI compensation without dynamic estimation of stress conditions may have a non-negligible impact on latency tail distributions and therefore may be avoided. Determining the stress condition may improve the distribution of computing resources because the tradeoff between determining a dynamic ICI compensation given certain stress conditions and the improvement of the BER may not be beneficial given the costs (e.g., time, computational resources, and the like) of performing the ICI compensation. In some instances, performing ICI compensation may decrease the BER. For example, as discussed herein, dense programming non-volatile memory storage devices (e.g., QLC devices) may employ incremental programming such that there is less programming interference (but there may still be interference due to retention, for example). Accordingly, it may not be efficient to apply interference compensation thresholds and the interference compensation thresholds may lead to increased BER. In other cases, dynamic ICI compensation may be dependent on the classified stress condition. Detecting the stress condition may be performed during a first tracking operation in the read flow. No additional overhead may be implemented when detecting the stress condition.

For example, when performing a conditional ICI operation, classifying and identifying a stress condition (e.g., retention stress and cross-temperature stress) may dictate the need for dynamic ICI compensation based on the stress condition. The dynamic ICI compensation follows a stress condition estimation that is performed during QT, where the stress condition estimation result is used to decide whether to apply ICI compensation before decoding.

The stress condition may be classified using classifiers such as support vector machines and/or neural networks. For example, various support vector machines (SVM) may use information from the computed histograms to classify stress conditions. For example, input information may include the interference state of the target row, a feature and a corresponding stress condition. The feature may be information obtained during a read operation of the target row (e.g., physical row number, program/erase cycle count, no-ICI commonly estimated thresholds (e.g., no-inter cell interference thresholds)).

In some arrangements, there may be one SVM per stress condition (e.g., one vs all classification). Each SVM may make a binary determination as to whether the histogram data input into the SVM corresponds to the particular stress class associated with the SVM.

The input histogram data may be transformed into a higher dimension (e.g., mapping the data to a new dimension, employing the "kernel trick" using sigmoid kernels, polynomial kernels, radial basis function kernels, and the like) such that the data is linearly separable. A decision boundary may be determined based on the dimension of the input data. The decision boundary may learn to separate the inputs into different classes by optimizing the decision boundary. The decision boundary may be optimized by taking the gradient of a cost function (such as the hinge loss function) to maximize the margin of the decision boundary with respect to the SVM class. The SVM may be trained using each histogram data and stress condition data such that the decision boundary is tuned over time. Arrangements of employing a neural network will be described with reference to FIG. 12 and FIG. 13.

If a relevant stress condition is identified (e.g., retention stress and/or cross-temperature stress as identified by the SVM or neural network), then performing dynamic ICI compensation given the multiple sources of interferences may be beneficial (e.g., decrease the BER, reduce the probability of soft decoding). Performing dynamic ICI compensation may include reducing the number of ICI states to an effective number of ICI states and averaging an ICI compensation shift for the effective ICI states. If a relevant stress condition is not identified (e.g., a relevant stress condition is not associated with the target row), then fixed ICI compensation (or no ICI compensation) may be applied to the target row. For example, a fixed ICI compensation may be selected from a predetermined table based on a computed histogram, a mock read, a read operation, or the like. Additionally or alternatively, soft decoding may be performed on the target row.

A dynamic ICI compensation threshold may be estimated for each of the k-ICI state clusters using mock reads and associated histograms, as discussed herein. Clustering the states (as described in the example of FIG. 8) beneficially reduces the number of effective states for a mock threshold estimation.

ICI states may be clustered (or otherwise associated) using sequential clustering algorithms such as k-means clustering. Each cluster of ICI states (e.g., an effective ICI state) may represent a collection of ICI states that are similar. ICI states may be grouped based on a similarity determination involving the distances of ICI states from a centroid. For instance, a centroid may be randomly generated. Each cluster of ICI states associated with k centroids may be determined to be a kth ICI effective state. ICI states may be clustered based on a relative distance between the ICI states (determined using histogram data) and the centroid. The centroid may be moved to a new relative location based on minimizing the average distance of each of the ICI states associated with the centroid. Each time the centroid moves, the distances between the centroid and the ICI states may be recalculated. The centroid may be moved iteratively closer to ICI states until a stopping criteria is met (e.g., ICI states do not change clusters, the sum of the distances is minimized, a maximum number of iterations is reached). In some configurations, the distances between the ICI states and the centroid may be determined using Euclidean distance. In other configurations, the distances between the ICI states and the centroids may be based on a similarity of correlated features of the ICI state (e.g., features of the histogram resulting in an ICI state).

Additionally or alternatively, each ICI state may be determined to be a centroid. For example, ICI states may be clustered based on the distances of the centroid ICI state to other ICI states. Distance measures may include, for example, the smallest maximum distance to other ICI states, the smallest average distance to other ICI states, and the smallest sum of squares distances to other ICI states. The clustered ICI states may be similar such that each of the clustered ICI states have a similar average shift from a no-ICI state. Accordingly, ICI compensation may be determined from a grouped/clustered state.

Additionally or alternatively, ICI states may be clustered based on similar effects induced on a target row. For example, there may be a case in which a single read operation is performed on a previous word line and on a next word line. Accordingly, there may be four states as shown in Expression 3 below:

$$L_p, L_m, H_p, H_m, \quad (3)$$

In expression 3, L denotes "low state" and H denotes "high state." Each of the states may be associated with the previous word line (p) and next word line (m). The four states may be clustered into three states as shown below:

| Cluster 1 | $(L_P, H_m) (L_m, H_P)$ |
| Cluster 2 | $(L_P, L_m)$ |
| Cluster 3 | $(H_m, H_p)$ |

In the example, the states may be clustered based on high (H) and low (L) interference. For example, cluster 1 may be determined based on whether the target row has an interference source from the next word line, which is high, and an interference source associated with the previous word line which was low (or the interference source from the next word line was high and the interference source associated with the previous word line was low). The shift on the target row (e.g., from H to L or L to H) is the same. Accordingly, the two states may be merged into a single cluster.

Cluster 2 may be created based on merging the ICI shift based on the interference source from a previous word line and the next word line being low. Similarly, cluster 3 may be created based on merging the ICI shift based on the interference source from the previous word line and the next word line being high. Accordingly, the number of ICI states may be reduced.

In an example, 16 states of interference may result from four ICI states induced from three reads of a next word line and three reads of a previous word line. Similar ICI states may be grouped/clustered into a smaller set of ICI states to reduce the number of ICI states to an effective number of ICI states. Reading a next word line and a previous word line and determining ICI states are described with reference to FIG. 7.

After the ICI states of different relevant rows (e.g., neighboring rows) have been clustered and the number of ICI states have effectively been reduced, mock reads may be performed on the target row. Performing the mock read may include using a fixed (or predetermined) set of mock thresholds to read the target row. The mock read may be a read with predefined thresholds which are reads only for sensing the histogram distribution of the target row.

The mock-read threshold can be used to facilitate the estimation of the optimal compensation for each histogram, as described herein. The selection of the mock-read thresholds may be optimized according to one or more of the following criteria: (1) minimizing the read-flow overhead while meeting the reliability specification. Accordingly, the minimal set of required mock thresholds (or a reduced set of mock thresholds) to compute a histogram with ICI information may be selected; (2) minimize the MMSE of added BER due to the ICI compensation; (3) minimize the tail distribution of the added BER over all of the stress conditions (e.g., a weighted MMSE).

Figure 9A:
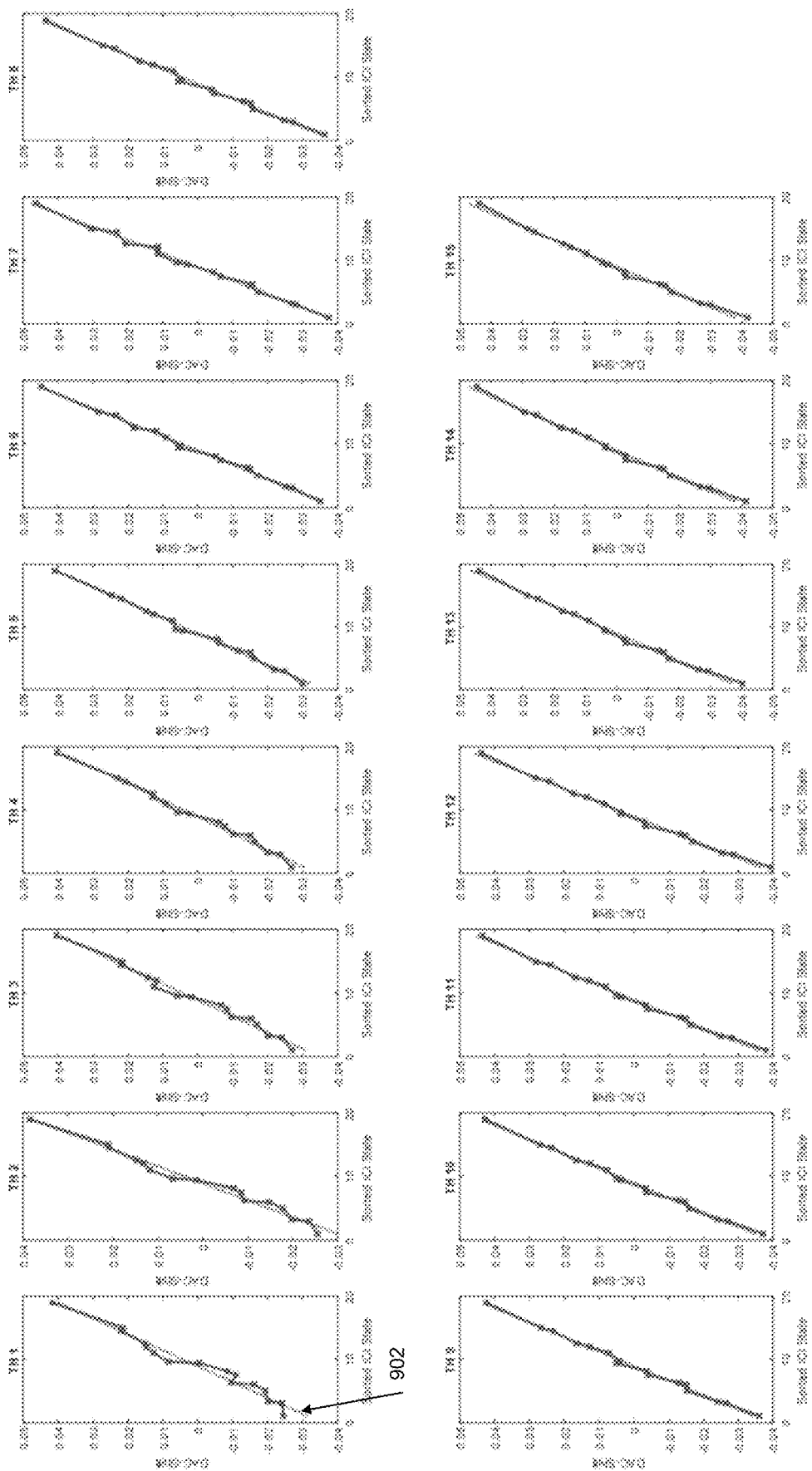
FIGS. 9A-9B show the relationship of 16 ICI states and the shift that is performed to correct the interference corresponding to the ICI state.
Figure 9B:
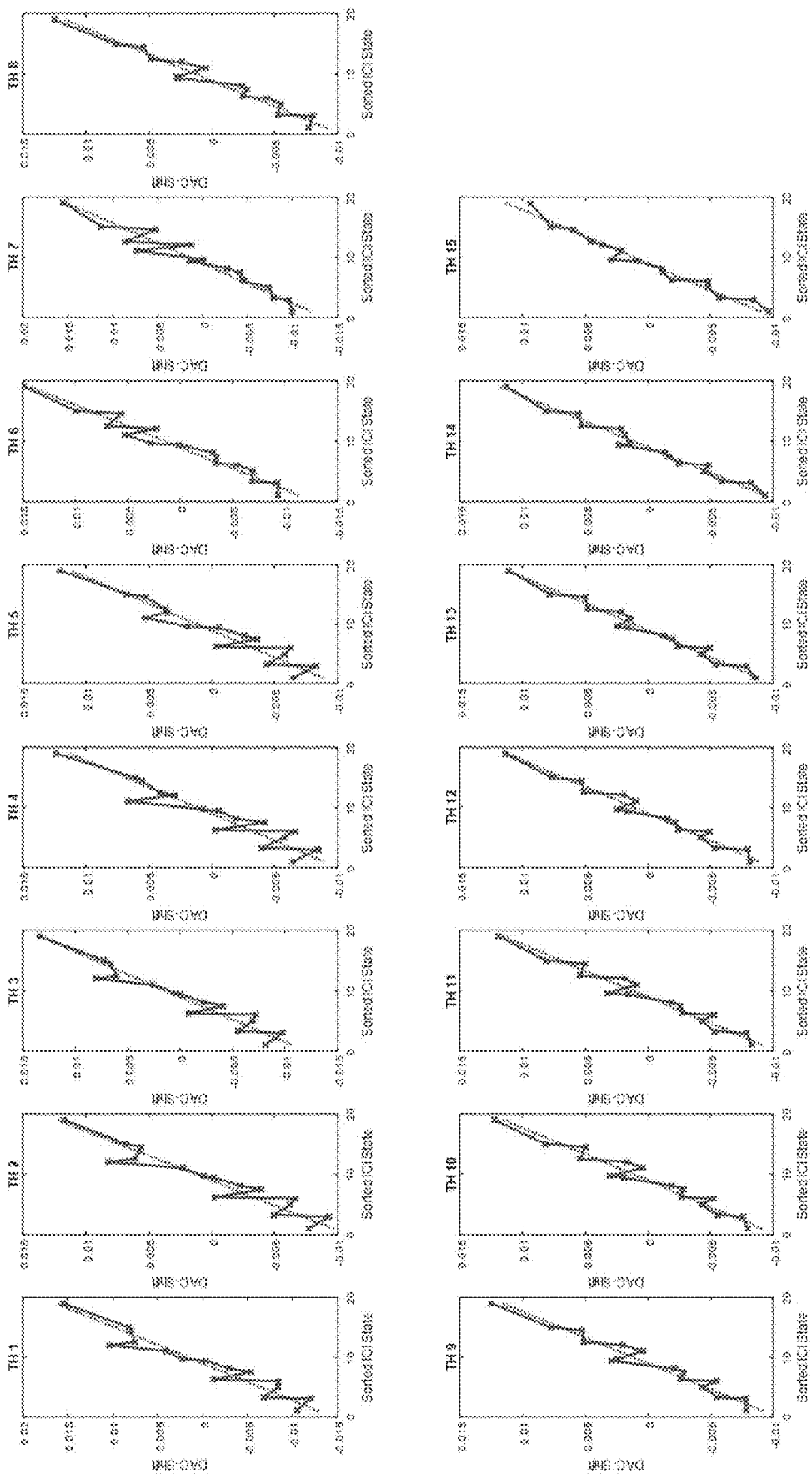
Figure 10A:
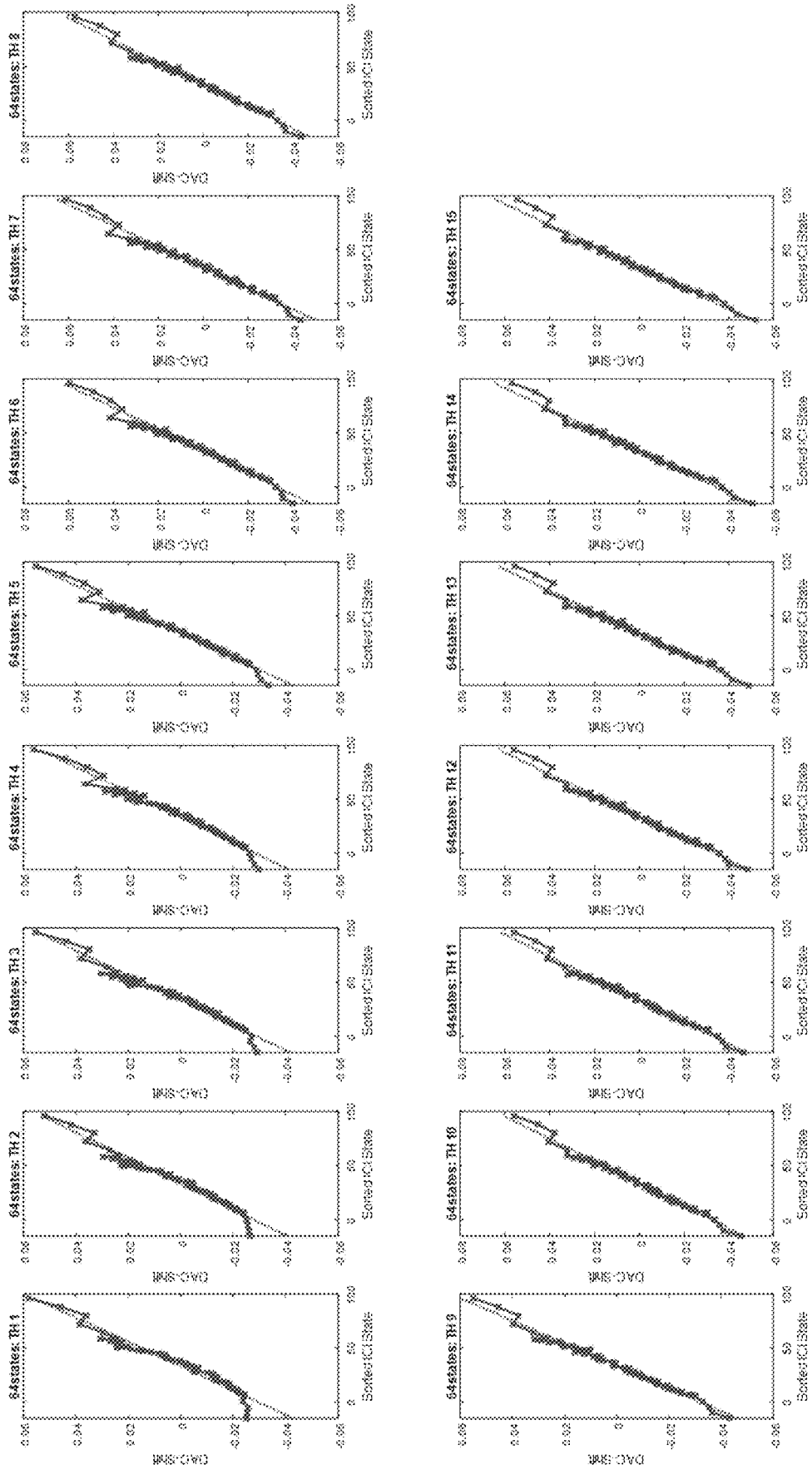
FIGS. 10A-10B show the relationship of 64 ICI states and the shift that is performed to correct the interference corresponding to the ICI state.
Figure 10B:
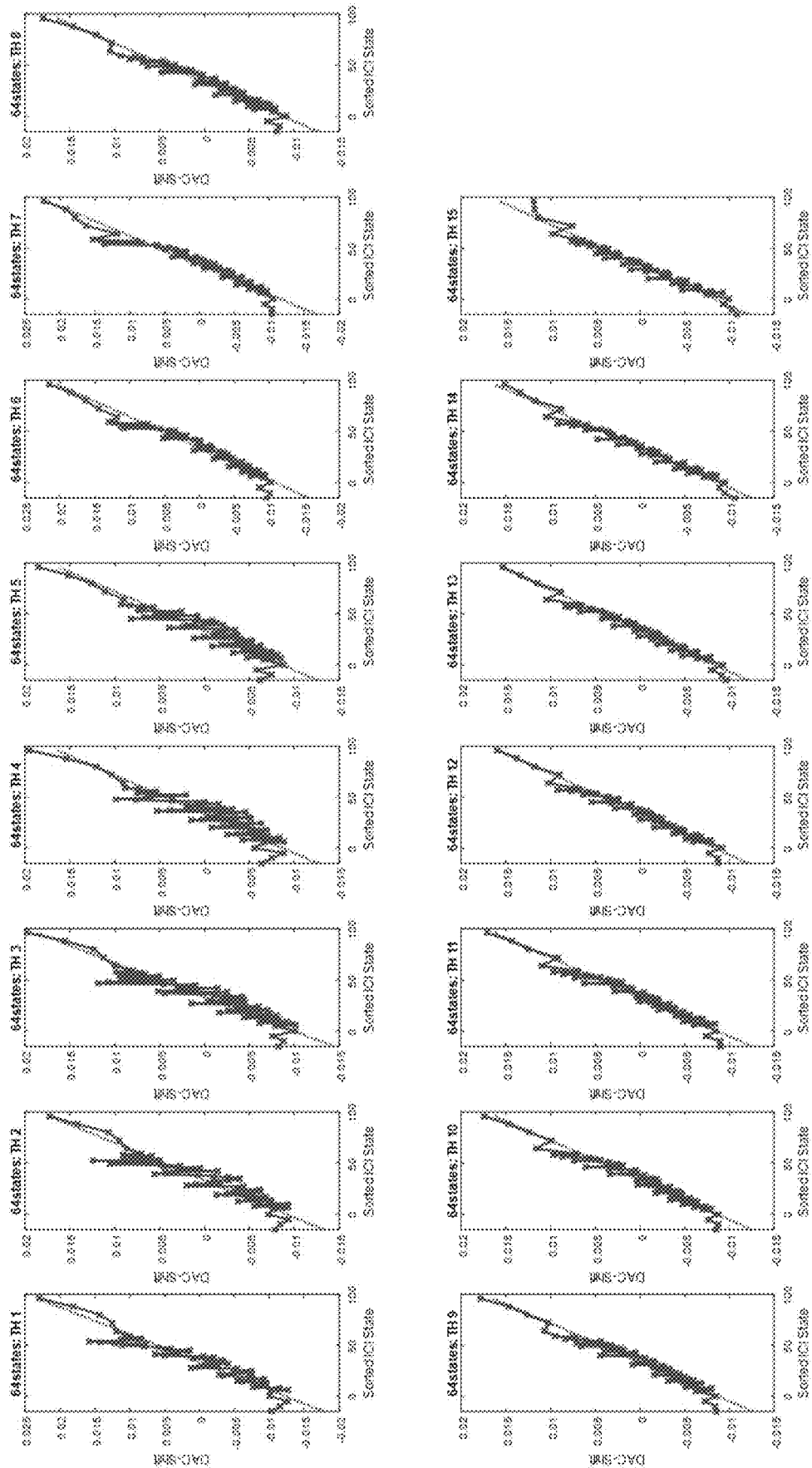

In some arrangements, a fixed ordering of multiple ICI states may be performed to replace the clustered ICI states and the compensation shift per ICI state. Modeling the ICI compensation as a function may avoid information loss that may occur when ICI states are clustered. Accordingly, a model function with parameters/coefficients may be used to determine the compensation per ICI state. Replacing the clustered ICI states with a model function may be performed if a fixed static ordering exists for the ICI states. For example, during both program disturb stress and retention stress conditions, the impact of interference may be consistent with ICI state orders. The ICI state ordering for 16 ICI states, for example, is illustrated in FIGS. 9A-9B, and the ICI state ordering for 64 ICI states is illustrated in FIGS. 10A-10B.

A model function may be optimized to parametrically describe the ICI compensation shift as a function of the ICI states given multiple ICI states. The non-uniform grid mapping for the ICI states (e.g., the x-axis mapping, as shown in FIGS. 9-10) may be optimized offline.

For example, an n-th degree polynomial may describe the compensation shift function, where, the compensation shift function may be modeled as shown in Expression 4:

$$f(x_i) = a_0 + a_1 x_i + a_2 x_i^2 + \cdots a_n x_i^n \quad (4)$$

Where i=1, . . . , k for k-ICI states, $x_i$ is the x-axis grid value for the i-th ICI state, and $a_0, \ldots, a_n$ are the polynomial coefficients. The coefficients may be dynamically estimated per threshold, per row, and/or per stress condition.

To estimate the device read thresholds per ICI state, the coefficients may be estimated using the linear estimator described in Expression 5:

$$\hat{\underline{A}}_{(n+1)D} = X_{(n+1)D \times K(M+1)} \cdot H_{K(M+1) \times 1} \quad (5)$$

A set of M mock thresholds may be used jointly with multiple reads of ICI which create k-states of the ICI. In Expression 5, $\hat{\underline{A}}$ is a (n+1)D×1 vector containing estimation results for the polynomial coefficients for each threshold, and D denotes the number of thresholds of D+1 programing states. The histogram vector $H_{K(m+1)}$ may reflect the histogram size for M mock read thresholds, M+1 histogram bins. The number of bins is multiplied by k-ICI states. Accordingly, the linear estimator employs a vector based on the read threshold to dynamically compensate the interference state of the effective number of interference states of the target row, a vector of the linear estimator based on values of the histogram, and a matrix of the linear estimator based on coefficients.

In an example, a non-volatile memory storage device (e.g., a TLC device, for instance), may have two sets of seven thresholds each corresponding to an ICI state. In a different example, a QLC device may have D=15 number of estimated thresholds.

Additionally or alternatively, the coefficients describing the optimal ICI compensation function may be estimated, per threshold, using a DNN. Arrangements of employing a deep-neural network will be described with reference to FIG. 12 and FIG. 13.

The ICI state may be represented on the x-axis (e.g., using a non-linear grid mapping, as indicated in FIGS. 9-10) and the threshold shift may be represented on the y-axis. For example, given a graphical representation describing the relationship between the clustered ICI states and the ICI compensation threshold shift, two parameters of the graphical representation may be an accurate mechanism of determining the threshold shift. Additionally or alternatively, the relationship between the clustered ICI states and the ICI compensation threshold shift may be indicated by an nth degree polynomial.

Modeling the relationship between the clustered ICI states and the ICI compensation threshold shift reduces the number of reads. In an example, three ICI reads may be performed on the next word line, and three ICI reads may be performed on the previous word line, resulting in a total of four ICI states per word line resulting in 16 total ICI states. Conventionally, an estimated ICI compensation threshold may be determined for each ICI state. However, given a limited length codeword, and having to estimate each of the thresholds for 16 states, the resources (time, computational processing powers, etc.) are effectively reduced for each of the states. That is, computing the thresholds for each state reduces the resources available for estimating a different state and/or completing other estimations/tasks using the resources such that the accuracy of estimating each state may be reduced.

Accordingly, the ICI compensation shift may be described relative to zero shift of different thresholds. That is, ICI compensation may be the shift responding to optimal thresholds such as ideal thresholds, for no ICI. The ICI compensation shift may be described as a function of the ICI state because when there is retention, for example, the ICI compensation increases as a function of the duration or retention of the stress impact. As described herein, the relationship of the ICI compensation shift and the ICI state may be determined by estimating, using a linear estimator and/or a linear estimator, at least two parameters of a linear curve or n-parameters of an nth degree polynomial.

Block 608 may be similar to block 508 in FIG. 5. In block 608, a single read command may be performed using the estimated thresholds from block 606. The reads may be saved on buffers so they may be used later on in the read flow. Hard bit decoding may be attempted of the read result on the target page. Block 610 may be similar to block 604. In block 610, it may be determined whether the hard decoding of the read result of the target page succeeded. If the hard decoding failed, the process may proceed to block 612. If the hard decoding succeeded, the process may end at block 611.

In block 612, a single read operation on the next word line row and a single read operation on the previous word line row (or any other main interference row) may be performed. If the stress conditions determined from block 606 do not indicate a retention condition and/or a cross temperature stress condition, then it may not be beneficial to dynamically compensate the ICI states based on the stress condition and the process may proceed to soft decoding (e.g., FIG. 15 or FIG. 16). If the stress conditions determined from block 606 indicate a retention stress and/or a cross temperature stress, then a histogram with ICI states and mock reads may be computed to determine the dynamic ICI shift thresholds per ICI state. A shift may be determined using a DAC converter for each ICI threshold using the single reads determined in block 602, the effective ICI states determined in block 606, and the histogram determined in block 606.

The thresholds for cluster 1 (including the states ($L_p$, $H_m$) ($L_m$, $H_p$)) may be previously estimated from a target row (if the previously estimated thresholds are available). Otherwise, the thresholds for cluster 1 may be the thresholds without ICI information.

To compute the DAC shift thresholds associated with the ICI states of cluster 2 and 3, a linear estimator or a DNN may be used. Arrangements of employing a neural network will be described with reference to FIG. 12 and FIG. 13.

A linear estimator may be used to compute the read thresholds for clusters 2 and 3 with ICI estimation (e.g., an example of QT). The linear estimator may be obtained according to Expression 6:

$$\hat{\underline{V}} = X_{A \times B} \cdot H_{B \times 1} \quad (6)$$

Where $\hat{\underline{V}}$ is a A×1 vector containing estimation results for thresholds, where the thresholds correspond to a different interference state (e.g., states associated with cluster 2 and states associated with 3). In the example described herein, A=30 (e.g., two sets of 15 thresholds). The vector $H_{B \times 1}$ contains the histogram values obtained from the mock reads and ICI single reads of the next word line and the previous word line. Lastly, the matrix $X_{A \times B}$ is the linear estimator coefficients matrix, which may be trained offline on a database of VT distributions containing a sample of the supported stress conditions.

In the example, a database may be configured with VT distributions and predetermined (fixed) mock read thresholds with state reads of the next word line and the previous word line for each row in the database. For each of the N rows in the database, a set of N histograms may be computed with labels corresponding to the optimal thresholds per row.

One example linear estimator that minimizes the thresholds estimation mean square error (MMSE) is shown in Expression 7:

$$X_{A \times B} = \min E[\underline{\hat{V}} - \underline{V}]^2 = V_{A \times N} \cdot H^T (H \cdot H^T)^{-1} \quad (7)$$

Where $H_{B \times N}$ is the histograms matrix and $V_{A \times N}$ is the optimal thresholds matrix. The BER associated with estimating a sub-optimal threshold may not be proportional to the threshold error relative to the optimal threshold. To evaluate the effect of the BER on the estimated threshold, the error function may be transformed from a threshold error to a function of added BER vs. threshold error.

This can be done for example by using a weight least squares algorithm for iteratively solving the thresholds MMSE by providing weights to each histogram sample, corresponding to the thresholds from previous MMSE iteration. That is, WMSE=$\Sigma w_i(\underline{\hat{V}} - V_i)$ where $w_i$ represents the normalized weight needed to translate the threshold error to BER, and next iteration of Expression (7) to solve the weighted MMSE is given by $X_{A \times B}(\text{iter}) = V_{A \times N} \cdot W_{iter} \cdot H^T (H \cdot W_{iter} \cdot H^T)^{-1}$ where $W_{iter}$ is an N×N diagonal matrix with weights $w_i$ on its diagonal. The weights are updated per iteration until weighted MSE loss is minimized. In other implementations, other polynomial functions may be used to compute the added BER as a function of threshold error and performing stochastic gradient descent to minimize the loss.

The estimated read thresholds for each interference state may be computed using the set of M mock thresholds jointly with multiple reads of the ICI information which is combined into k-ICI states. For example, the estimated read thresholds per ICI state may be given by Expression 8:

$$\underline{\hat{V}}_{KD} = X_{KD \times K(M+1)} \cdot H_{K(M+1) \times 1} \quad (8)$$

Where $\underline{\hat{V}}$ is a KD×1 vector containing estimation results for D thresholds of D+1 possible programmed states. In the case of a TLC device, D=7 and there may be two sets of seven thresholds where each threshold corresponds to an ICI state. In the case of a QLC device, D=15 may be the number of estimated thresholds. In Expression 8, the histogram vector of K(M+1) may reflect the histogram size. For example, when M mock read thresholds are used, there are M+1 histograms, multiplied by k-ICI states.

In block 614, a manual hard bits operation may be performed. The manual hard bit operation may include applying a compensation offset value as a function of the stress condition clusters (e.g., clusters 2 and 3 determined in block 606) per threshold. Two additional full reads may be performed using the fixed shift of thresholds. A single input hard bit codeword may be formed by choosing the parts according to ICI state information from the read results. In some arrangements, a hard decoding attempt may be performed on the read results.

Block 616 may be similar to blocks 604 and 610. In block 616, it may be determined whether the hard decoding of the read result of the target page succeeded. If the hard decoding failed, the process may proceed to block 618. If the hard decoding succeeded, the process may end at block 611.

In block 618, two additional full page read (or other reads) may be performed to obtain soft bit information such that soft bit decoding may be performed (e.g., using the soft information generator 113 of FIG. 1). For example, two read operations may be performed and two ICI may be compensated using fixed shifts relative to the estimated thresholds from block 606. If the stress conditions were identified as including retention and/or cross temperature, then the soft bit information may be combined with the read information from block 614 to provide labels for the decoder (e.g., the ECC decoder 112 in FIG. 1). If the stress conditions were identified as not including retention and/or cross temperature, then the soft bit information may be combined with the read information from block 608. The soft bit decoding read flow is described with reference to FIGS. 15 and 16 as described herein.

Figure 7:
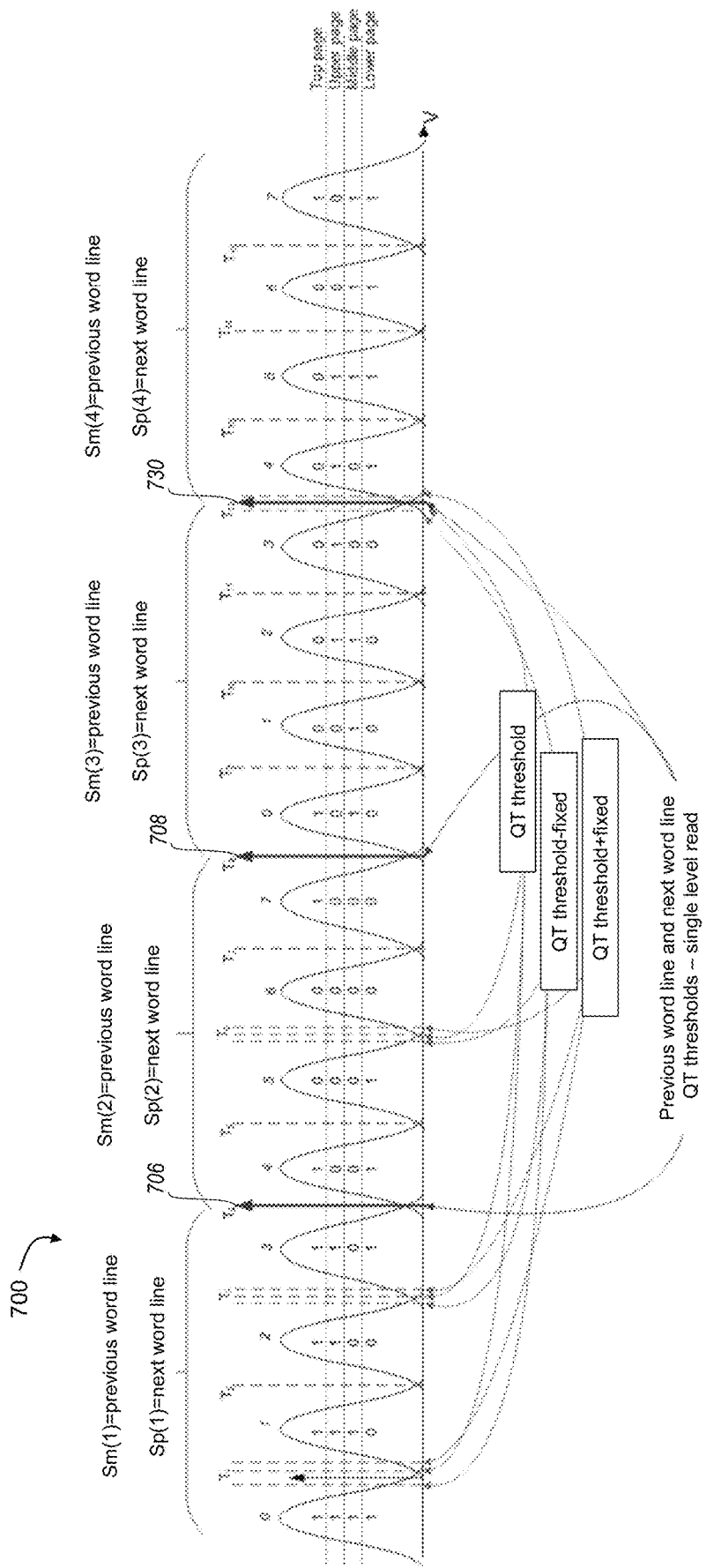
FIG. 7 is a diagram of multiple read operations being performs on a histogram with VT distributions of a non-volatile memory storage device, according to some arrangements.

FIG. 7 is a diagram of multiple read operations being performs on a histogram with VT distributions of a four bpc non-volatile memory storage device (e.g., a flash memory device such as QLC with 16 programmable states), according to some arrangements. As shown, six single state reads from two different rows (e.g., three reads from each row) are used to obtain ICI information. Thresholds 706, 708, and 730 are used to read ICI information from the next row and the previous row (e.g., the next word line and the previous word line), where $S_m(i)$, i=1, . . . , 4 and Sp (i), i=1, . . . , 4 indicate the information obtained from the reads. Every pair $(S_m(i), S_p(i))$ is an ICI state for i=1, . . . , 4. The 16 ICI states may induce compensation thresholds for estimation, which may end up an inaccurate estimations using a limited size row information. Each of the ICI state pairs $(S_m(i), S_p(i))$ may be clustered into groups to improve the ICI compensation threshold shift estimation.

Figure 8:
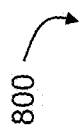
FIG. 8 shows an example of clustering the ICI state pairs into groups to improve the ICI compensation threshold shift estimation, according to some arrangements.

FIG. 8 shows an example 800 of clustering the ICI state pairs into groups to improve the ICI compensation threshold shift estimation, according to some arrangements. Clustering the ICI state pairs reduces the number of states into an effective number of states. As shown, the ICI states may clustered into five clusters, where each of the five clusters are almost equal in size. Accordingly, the number of ICI states is reduced from 16 states to effectively five states, facilitating a more robust compensation threshold estimation.

FIGS. 9A-9B and 10A-10B show the relationship of ICI and the shift that is performed as induced by the interference corresponding to the ICI state. For each threshold, the respective average lobe shifts was computed as a function of the ordered ICI state index. As shown, relative to the zero shift, each ICI state may have a different shift. FIGS. 9A-9B and 10A-10B show ICI states that have been grouped according to samples in a database. FIGS. 9A-9B show an example average shift per ICI state for 16 states while FIGS. 10A-10B show an example average shift per ICI state for 64 states. The 64 states in FIGS. 10A-10B may be obtained, for example, by performing reads with seven thresholds to one interference row and an additional seven-threshold to another interference row. Accordingly, there may be eight zones in each row, which may map to 64 ICI states. Both FIGS. 9A and 10A indicate the ICI induced by one year retention stress, while FIGS. 9B and 10B indicate the ICI induced by program disturb stress.

The x-axis in FIGS. 9A-9B and 10A-10B is a non-uniform grid that may be estimated by evaluating the samples in the database to model the relationship of the ICI states and the shift. That is, the non-uniform grid is assigned for the sorted ICI state index. As shown, the resulting shift function as a function of the ICI state index corresponds to a linear curve. The relationship may be modeled using a linear estimator to estimate the model parameters in the database. For example, as shown in FIG. 9A, the estimated relationship 902 may be based on estimating the slope and bias for each threshold shift. As shown, the error between the estimated shift per ICI state 902 and the ordered states is small. The y-axis indicates the induced DAC shift, but is a voltage shift in millivolts, for example.

Figure 11:
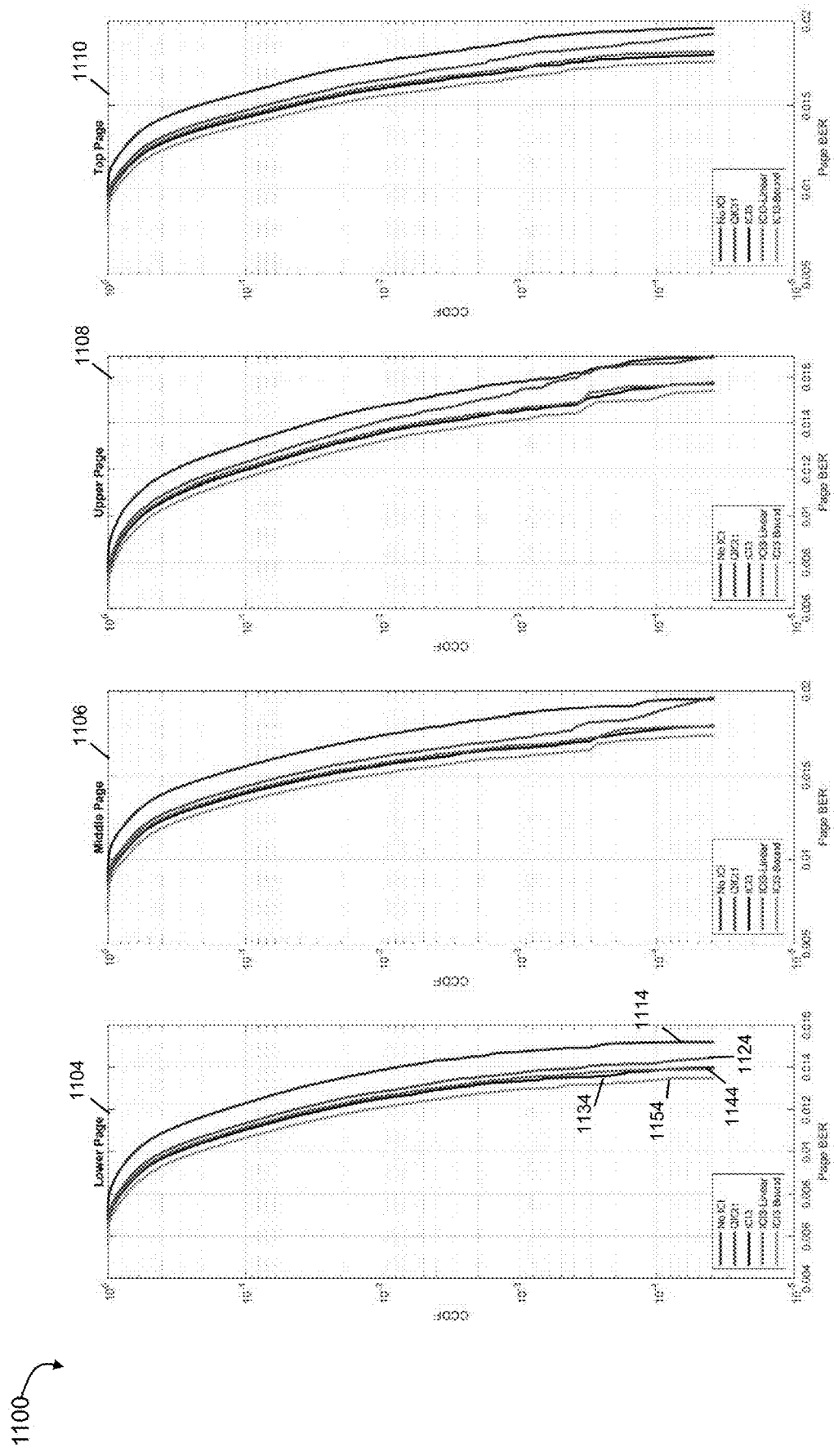
FIG. 11 is an example of BER distributions from a non-volatile memory storage device and two sources of interference.

FIG. 11 is an example 1100 of BER distributions from a non-volatile memory storage device and two sources of interference. As shown, the non-volatile memory storage device is a QLC device. Graph 1104 indicates a BER distribution for a lower page, graph 1106 indicates a BER distribution for a middle page, graph 1108 indicates a BER distribution for an upper page, and graph 1110 indicates a BER distribution for a top page. The x-axis of the graphs indicate a BER and the y-axis indicates a complimentary cumulative distribution function (CCDF).

The example 1100 illustrates the effect of ICI compensation on improving the BER. As shown, the lower page 1104 BER distribution without ICI reads is line 1114. Line 1114 denotes the BER measured with optimal thresholds (e.g., without any ICI compensation). The lower page 1104 BER distribution using two ICI SLC reads of the next word line and the previous word line to determine three states is indicated by line 1124 ("QICI1"). The optimal compensation is estimated per row/threshold. The lower page 1104 BER distribution using six ICI SLC reads of the next word line and the previous word line to determine five ICI states is indicated by line 1134 ("ICI3"). The optimal compensation is estimated per row/threshold and the optimal thresholds are used to read post ICI3 compensation (e.g., by QT and/or PST). The lower page 1104 BER distribution using six ICI SLC reads of the next word line and the previous word line to determine 16 ICI states is indicated by line 1144 ("ICI3 Linear") (e.g., using the linear curve estimation determined via the estimated polynomial function). The compensation may follow the computation of the lobe shift per ICI state and the linear curve coefficients may be determined. Further, the optimal thresholds may be used to read post ICI3 compensation. The lower page 1104 BER distribution using six ICI SLC reads of the next word line and the previous word line to determine 16 states is indicated by line 1154 ("ICI3 Bound"). The optimal shift may be applied for each of the ICI states per row/threshold and the optimal read threshold may be used for BER computation. The optimal shift applied to each of the ICI states may be a bound on the ICI compensation.

Figure 12:
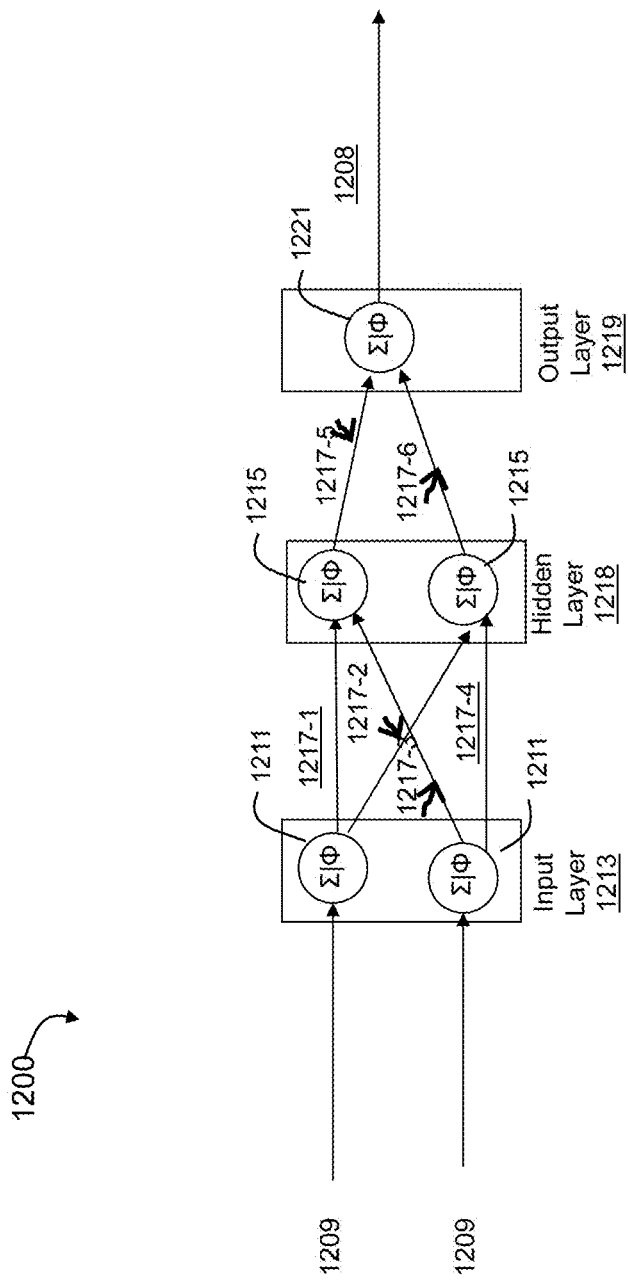
FIG. 12 is a block diagram of a multi-layer perceptron network, according to some arrangements.

FIG. 12 is a block diagram of a multi-layer perceptron network 1200, according to some arrangements. As shown, the network 1200 is a fully connected network. The neural network 1200 may be implemented within the non-volatile storage device 100. For example, the network 1200 may be implemented within the controller itself, as a firmware software implementation running via an embedded CPU or as a hardware implementation, depending on the firmware memory and latency performance specifications.

The neural network model 1200 may include a stack of distinct layers (vertically oriented) that transform a variable number of inputs 1209 being ingested by an input layer 1213, into an output 1208 at the output layer 1219. The network 1200 may be trained on a training dataset including features, mock and ICI based histogram vectors, and a corresponding read threshold, stress condition and/or polynomial coefficient. For example, interference states of the target row, features and a corresponding read threshold, stress condition and/or polynomial coefficient may be used in a training dataset.

As discussed herein, the network 1200 may be used to estimate dynamic ICI compensation thresholds, stress conditions, and/or polynomial coefficients using one or more of mock reads, ICI read results and additional features and an input layer 1213 and one or more hidden layers 1218. In other arrangements, the network 1200 may not include any hidden layers 1218. The inputs 1209 may be received by the input layer 1213 as a vector.

In some arrangements, the network 1200 may be a chain of neural networks such that the stress condition, polynomial coefficients and/or threshold to dynamically compensate ICI may be estimated. The architecture of the networks trained to estimate the various outputs 1208 (e.g., ICI compensation thresholds, stress conditions, and/or polynomial coefficients) may each be different. For example, the architecture of the networks may have a different number of hidden layers 1218 or a different model (e.g., random forests, SVM). Additionally or alternatively, the architecture of the networks may be the same (e.g., same number of hidden layers, same type of network (convolutional neural network)).

The mock reads (or histograms from the soft samples) and one or more ICI read inputs 1209 to the network 1200 may be a computed histogram vector from the mock reads and ICI reads. The feature inputs 1209 may include a stress classification score (e.g., received from a different network employed to determine a stress classification), physical row number, program/erase cycle count, no-ICI commonly estimated thresholds, and other information obtained during a read operation. Some features, like no ICI commonly estimated thresholds may depend on the read flow implementation. In some arrangements, the read with ICI information may follow a threshold tracking state that acquires thresholds without ICI for the target row.

Using feature data in addition to histogram vector information (e.g., from the mock and ICI reads) allows the network 1200 to learn, and benefit from, the interplay between the features of the cell. For example, training the network 1200 to predict/estimate the compensated ICI thresholds with feature data may result in improved estimated compensated ICI threshold. For example, the feature information may convey information about the environment of the cell (e.g., stress conditions) that allows the network 1200 to better learn the relationship between the estimated compensated ICI thresholds (output 1208) and the mock read and ICI read inputs 1209.

The input layer 1213 includes neurons 1211 connecting to each of the neurons 1215 of the hidden layer 1218. The neurons 1215 in the hidden layer 1218 connect to neuron 1221 in the output layer 1219. Depending on what the network 1200 is trained to do, the output layer 1219 may generate a vector 1208 indicating the estimated read thresholds (e.g., the ICI compensation thresholds) if the network is being employed to estimate the ICI compensation threshold. The network 1200 may also be trained to generate an output vector 1208 of polynomial coefficients if the network is employed to estimate polynomial coefficients.

Additionally or alternatively, the output layer 1219 may be a softmax classifier using a softmax function (e.g., a normalized exponential function) to transform an input of real numbers into a normalized probability distribution over predicted output classes. That is, if the network 1200 is employed to determine a stress classification, the output layer 1219 may generate a score for each stress condition such that the highest score corresponds to the most likely estimated stress condition. The network 1200 may include a number of hidden layers 1218 between the input 1213 and the output layer 1219.

Generally, neurons (1211, 1215, and 1221) perform particular computations and are interconnected to neurons of adjacent layers. Each of the neurons 1211, 1215 and 1221 sum the values from the adjacent neurons and apply an activation function, allowing the network 1200 to learn non-linear patterns. The network uses the non-linear patterns to learn non-linear relationships between the inputs (e.g., information associated with the, features, mock reads and ICI read results) and the output (e.g., the estimated ICI compensated threshold, stress conditions, polynomial coefficients, or the like).

Each of the neurons 1211, 1215 and 1221 are interconnected by algorithmic weights 1217-1, 1217-2, 1217-3, 1217-4, 1217-5, 1217-6 (collectively referred to as weights 1217). Weights 1217 are tuned during training to adjust the strength of the neurons. The adjustment of the strength of the neuron facilitates the network 1200 ability to learn non-linear relationships. The algorithmic weights are optimized during training such that the network 1200 learns estimated compensation thresholds.

Figure 13:
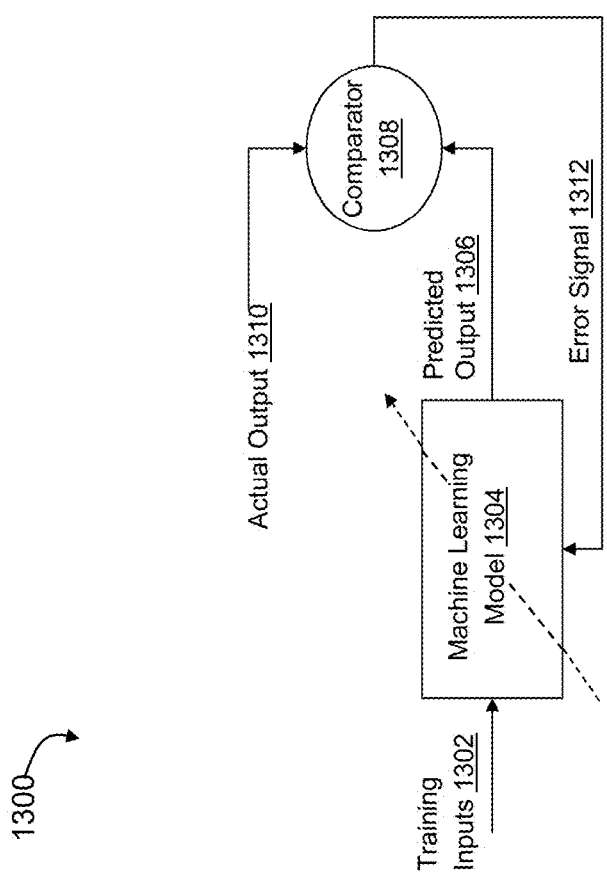
FIG. 13 is a block diagram of an example machine learning model using supervised learning, according to some arrangements.

The network 1200 may be trained using supervised learning. FIG. 13 is a block diagram of an example 1300 machine learning model (e.g., network 1200 in FIG. 12) using supervised learning, according to some arrangements. Supervised learning is a method of training a machine learning model given input-output pairs. An input-output pair is an input with an associated known output (e.g., an expected output).

The machine learning model 1304 may be trained on known input-output pairs such that the machine learning model 1304 can learn how to predict known outputs given known inputs. Once the machine learning model 1304 has learned how to predict known input-output pairs, the machine learning model 1304 can operate on unknown inputs to predict an output.

Training inputs 1302 and actual outputs 1310 may be provided to the machine learning model 1304. Training inputs 1302 may include the mock reads (or soft samples), ICI read results, and features. Actual outputs 1310 may include optimal ICI compensated thresholds, stress conditions, or polynomial coefficients.

In an arrangement, the machine learning model 1304 may be trained using training inputs 1302 (e.g., mock reads, ICI reads, and other features) to predict outputs 1306 (e.g., estimated optimum ICI compensated thresholds) by applying the current state of the machine learning model 1304 to the training inputs 1302. The comparator 1308 may compare the predicted outputs 1306 to the actual outputs 1310 (e.g., actual measured and/or calculated optimum ICI compensated thresholds) to determine an amount of error or differences. For example, the estimated/predicted optimum ICI compensated thresholds (e.g., predicted outputs 1306) will be compared to the actual/measured optimum ICI compensated threshold (e.g., actual output 1310).

Additionally or alternatively, the machine learning model 1304 may be trained using training inputs 1302 (e.g., soft samples, and other features) to predict outputs 1306 (e.g., estimated optimum ICI compensated thresholds) by applying the current state of the machine learning model 1304 to the training inputs 1302. The comparator 1308 may compare the predicted outputs 1306 to the actual outputs 1310 (e.g., actual measured and/or calculated optimum ICI compensated thresholds) to determine an amount of error or differences. For example, the estimated/predicted optimum ICI compensated thresholds (e.g., predicted outputs 1306) will be compared to the actual/measured optimum ICI compensated threshold (e.g., actual output 1310).

Additionally or alternatively, the machine learning model 1304 may be trained using training inputs 1302 (e.g., mock reads, ICI reads, and other features) to predict outputs 1306 (e.g., stress conditions) by applying the current state of the machine learning model 1304 to the training inputs 1302. The comparator 1308 may compare the predicted outputs 1306 to the actual outputs 1310 (e.g., identified stress condition) to determine an error or difference. For example, the estimated/predicted probability of the stress condition (e.g., predicted outputs 1306) will be compared to the actual stress condition (e.g., actual output 1310).

Additionally or alternatively, the machine learning model 1304 may be trained using training inputs 1302 (e.g., mock reads, ICI reads, and other features) to predict outputs 1306 (e.g., polynomial coefficients) by applying the current state of the machine learning model 1304 to the training inputs 1302. The comparator 1308 may compare the predicted outputs 1306 to the actual outputs 1310 (e.g., polynomial coefficients determined using a different method) to determine an error or difference. For example, the value of the polynomial coefficient (e.g., predicted outputs 1306) will be compared to a different measured coefficient value (e.g., actual output 1310).

During training, the error (represented by error signal 1312) determined by the comparator 1308 may be used to adjust the weights in the machine learning model 1304 such that the machine learning model 1304 learns over time. The machine learning model 1304 may be trained using a backpropagation algorithm, for instance. The backpropagation algorithm operates by propagating the error signal 812 through weights in the machine learning model 1304 (e.g., weights 1217 in FIG. 12). The error signal 1312 may be calculated each iteration (e.g., each pair of training inputs 1302 and associated actual outputs 1310), batch and/or epoch, and propagated through the weights in the machine learning model 1304 such that the algorithmic weights adapt based on the amount of error. The error is minimized using a loss function. Non-limiting examples of loss functions may include the square error function, the room mean square error function, and/or the cross entropy error function.

The weighting coefficients of the machine learning model 1304 may be tuned to reduce the amount of error, thereby minimizing the differences between (or otherwise converging) the predicted output 1306 and the actual output 1310. The machine learning model 1304 may be trained until the error determined at the comparator 1308 is within a certain threshold (or a threshold number of batches, epochs, or iterations have been reached). The trained machine learning model 1304 and associated weighting coefficients may subsequently be stored such that the machine learning model 1304 may be employed on unknown data (e.g., not training inputs 1302). Once trained and validated, the machine learning model 1304 may be employed during a testing (or an inference phase). During testing, for example, the machine learning model 1304 may ingest unknown data to predict/estimate optimum ICI compensated thresholds, stress conditions, and/or polynomial coefficients. Using the systems and methods described herein, the non-volatile storage device 100 can have a formalized approach to estimating optimum ICI compensated thresholds, stress conditions, and/or polynomial coefficients.

Figure 14:
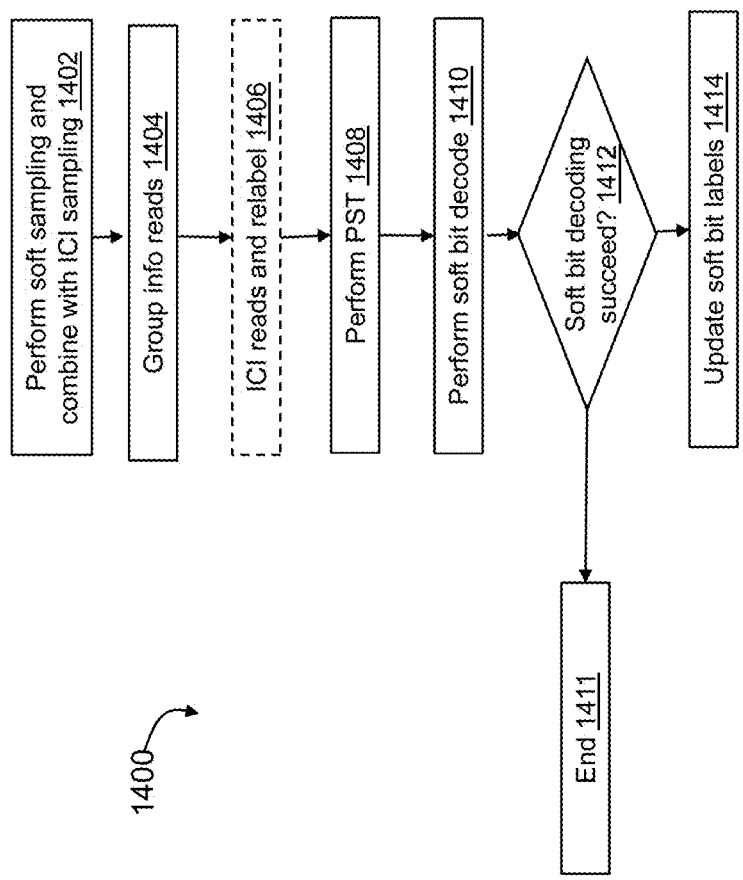
FIG. 14 is a soft bit decoding read flow to determine read thresholds for ICI compensation utilizing fixed ICI compensation for multiple ICI reads, according to some arrangements.

FIG. 14 is a soft bit decoding read flow 1400 to determine read thresholds for ICI compensation utilizing fixed ICI compensation for multiple ICI reads, according to some arrangements. The soft read flow 1400 uses soft bit sampling of the target row. In an example, the number of reads in the read flow 1400 is 40. Soft bit sampling may be used to estimate the read thresholds for ICI compensation to improve quality of service and estimation accuracy. In some arrangements, read flow 1400 is performed when the hard decoding fails (e.g., after read flow 500 in FIG. 5 fails).

In this example, the process being in block 1402 where soft sampling is performed and combined with ICI sampling. In an example, five-bit resolution soft sampling is performed around thresholds (e.g., QT thresholds estimated from the read flow 500 of fixed ICI compensation for hard bit decoding in from block 506 in FIG. 5). In some configurations, the number of full page reads performed for soft sampling may be 31.

In block 1404, a group read may be performed. The group info reads may be used to distinguish between cells around each target threshold. For example, three SLC reads may be performed to separate lobe regions of the histograms.

In block 1406, ICI reads and re-labeling may be optionally performed if retention stress was estimated during QT. For example, six SLC reads (e.g., three reads of a next word line and three reads of a previous word line) may be used to determine 16 ICI states. Then, a fixed shift on the soft samples may be applied for each ICI state. For example, fixed (or predetermined) labels may be applied to relabel ICI compensation thresholds. The shift on soft samples is a re-mapping operation of the initial soft LLR to a different soft LLR depending on the shift per state. If retention stress was not estimated during QT, then the process may proceed to block 1408.

In block 1408, pre-soft tracking (PST) may be performed. PST may be an algorithm that uses the soft labels to determine optimal thresholds. A simple example for a PST algorithm includes computing a histogram of soft sampled inputs around a specific threshold and determining the minimal BER thresholds by the location of the histogram minimum. When ICI states are available, the minimum of a histogram for each ICI state may be used to determine the optimal (dynamic) thresholds for ICI compensation. PST may be performed before soft decoding the soft samples. As a result of performing PST, soft bit decoding labels may be updated. PST may be used to find the optimal threshold after ICI compensation for each of the target page thresholds per group. That is, the hard decoding decision thresholds per group may be adjusted after ICI compensation using soft sampling and relabeling. PST may be applied for each ICI state.

If there is no ICI information, histograms of soft sample VT distributions may be computed using a minimum search and/or model fit (e.g., Laplacian distribution) for histograms around each target threshold. The optimal threshold may be estimated, and the soft samples may be mapped to LLRs.

PST tracking may also be applied when multi-state ICI information is available. For each ICI state, corresponding optimal thresholds may be estimated, and LLRs may be assigned to each ICI state to provide the decoder (e.g., ECC decoder 112 of FIG. 1) post ICI compensation LLR inputs. Additionally or alternatively, a neural network (e.g., neural network 700) may be employed to find the optimal thresholds.

In block 1410, soft bit decoding may be performed. For example, a soft decoder (e.g., ECC decoder 112 of FIG. 1) may be used for decoding. In block 1412, it may be determined whether the soft decoding of the target page succeeded. If the soft decoding succeeded, the process may end at block 1411. If the soft decoding failed, the process may proceed to 1414. In an example, the process may proceed to block 1414 if the decoded BER did not satisfy a threshold (e.g., an accuracy threshold).

In block 1414, the soft bit labels may be updated. For example, LLR mapping may be performed on the soft labels. Additionally or alternatively, dynamic LLR estimation may be performed. For example, a soft decoder (EEC decoder 112 of FIG. 1) may generate a temporary error vector by monitoring or examining results of the decoding attempt (e.g., the soft decoding attempt in block 1410). The soft decoder may obtain an adapted LLR mapping or LLR value based on the temporary error vector generated on the failure of previous soft decoding attempts. Dynamic LLR estimation is described in more detail in U.S. Pat. No. 10,963,338, titled "SYSTEM AND METHOD FOR DECODER ASSISTED DYNAMIC LOG-LIKELIHOOD RATIO ESTIMATION FOR NON-VOLATILE MEMORIES," filed on Sep. 12, 2019 by Avi Steiner and Hanan Weingarten, which is incorporated by reference herein in its entirety.

Figure 15:
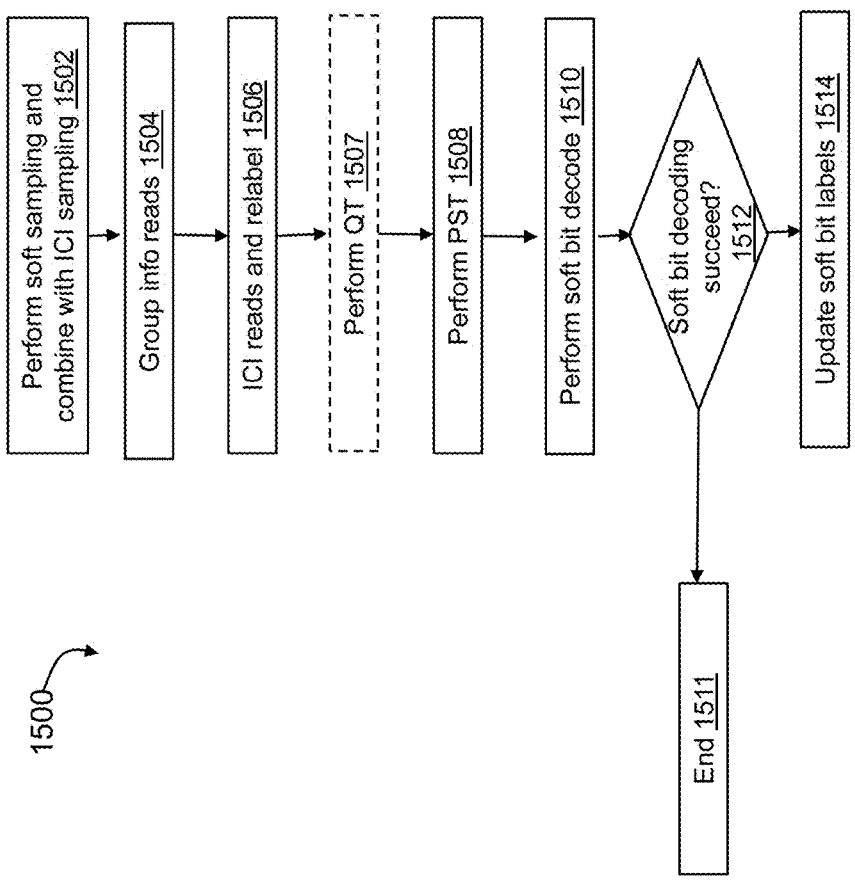
FIG. 15 is a soft bit decoding read flow to determine read thresholds for ICI compensation utilizing dynamic ICI compensation for multiple reads per ICI state, according to some arrangements.

FIG. 15 is a soft bit decoding read flow 1500 to determine read thresholds for ICI compensation utilizing dynamic ICI compensation for multiple reads per ICI state, according to some arrangements. As discussed herein, while performing multiple reads of interference rows may increase the resolution of the interference information, performing multiple reads may also induce ICI states. The ICI states may be grouped into a small number of groups with similar interference effects, and a single ICI compensation shift may be estimated for each group.

The maximum number of read operations for the read flow 1500 is the same number as the maximum number of read operations for the read flow 1400 in FIG. 14 (e.g., 40 reads). Although performing the same number of read operations, the read flow 1500 is an improvement of the read flow 1400 described in FIG. 14. Using dynamic ICI compensation to determine adapted read thresholds for a target page instead of using fixed ICI compensation may improve the BER and speed of decoding. The read flow 1500 utilizes dynamic estimation for ICI compensation without any additional latency overhead compared to the read flow 1400 in FIG. 14.

Block 1502 may be similar to block 1402 in FIG. 14. In block 1502, soft sampling is performed and combined with ICI sampling. In an example, five-bit resolution soft sampling is performed around thresholds (e.g., QT thresholds estimated from the read flow 600 of dynamic ICI compensation using stress condition classification for hard bit decoding in from block 606 in FIG. 6). In some configurations, the number of reads performed for soft sampling may be 31.

Block 1504 may be similar to block 1404. In block 1504, a group read may be performed. The group info reads may be used to distinguish between cells around each target threshold. For example, three state reads may be performed to separate lobe regions of the histograms. In an example, a TLC NAND may use three single state reads to separate four thresholds (e.g., FIG. 2).

Block 1506 may be similar to block 1406 in FIG. 14. In block 1506, ICI reads and re-labeling may be performed. For example, three reads of a next word line and three reads of a previous word line may be used to determine 16 ICI states. In some arrangements, multiple ICI states may be grouped into states with similar interference impacts (as described in FIG. 8). For example, 16 ICI states may be grouped into five effective states using three buffers.

In block 1507, QT may be performed. QT may be performed if the QT mock reads were saved from the hard decoding read flow (e.g., the mock read threshold determination in read flow 600 and particularly in block 606 in FIG. 6). A QT operation may be performed using the previous mock read thresholds (as discussed) and effective ICI states per cell so as to compute ICI compensation for each effective ICI state. For example, using the effective ICI state per bit and the mock reads, histograms may be computed and effective per state ICI compensation thresholds may be estimated. The estimated threshold shifts may be applied to each effective ICI state. The shift on soft samples is a re-mapping operation of the initial soft LLR to a different soft LLR depending on the shift per state.

Block 1508 may be similar to block 1408 in FIG. 14 if the QT was performed in block 1507. In block 1508, PST may be used to find the optimal threshold after ICI compensation for each of the target page threshold per group. That is, the hard decoding decision thresholds per group may be adjusted after ICI compensation using soft sampling and relabeling. PST may be applied for each ICI state.

If block 1507 was not performed (e.g., the mock reads from the hard decoding read flow were not saved), then block 1508 may be different from block 1408. For example, in block 1508, effective ICI compensation per state may be computed using the PST operation. Using the effective ICI state per bit and the soft samples, histograms may be computed using the ICI state. Compensation thresholds may be estimated using PST per effective state (e.g. using a linear estimator or a DNN). Each group and state may be relabeled.

Block 1510 may be similar to block 1410. In block 1510, soft bit decoding may be performed. For example, a soft decoder (e.g., ECC decoder 112 of FIG. 1) may be used for decoding. In block 1512, it may be determined whether the soft decoding of the target page succeeded. If the soft decoding succeeded, the process may end at block 1511. If the soft decoding failed, the process may proceed to 1514.

Block 1514 may be similar to block 1414 in FIG. 14. In block 1514, the soft labels may be updated. For example LLR mapping (or dynamic LLR estimation) may be performed on the soft labels.

Figure 16:
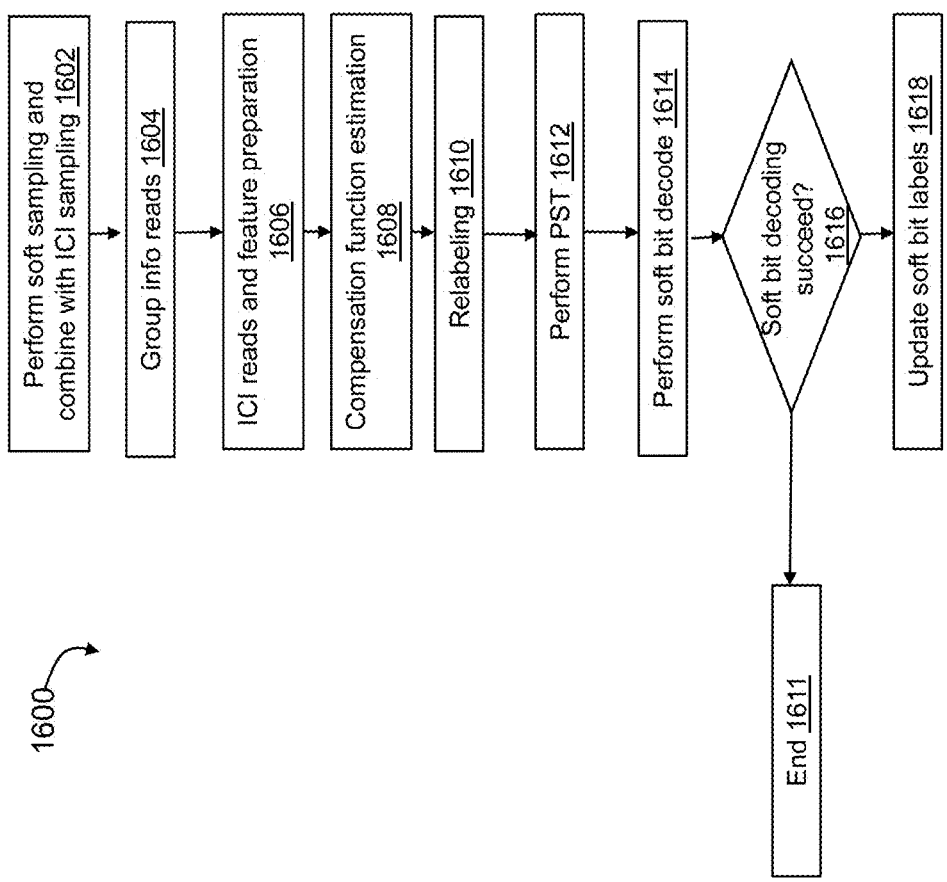
FIG. 16 is a soft bit decoding read flow to determine read thresholds for ICI compensation utilizing dynamic ICI compensation for multiple reads per ICI state with estimation of polynomial coefficients for computing the ICI compensation, according to some arrangements

FIG. 16 is a soft bit decoding read flow 1600 to determine read thresholds for ICI compensation utilizing dynamic ICI compensation for multiple reads per ICI state with estimation of polynomial coefficients for computing the ICI compensation, according to some arrangements. As discussed herein, while performing multiple reads of interference rows may increase the resolution of the interference information, performing multiple reads may also induce ICI states. The ICI states may be modeled such that a dynamic ICI compensation may be determined per state.

The maximum number of read operations for the read flow 1600 is the same number as the maximum number of read operations for the read flow 1400 in FIGS. 14 and 1500 in FIG. 15 (e.g., 40 reads). Although performing the same number of read operations, the read flow 1600 is an improvement of the read flow 1400 described in FIG. 14. Using dynamic ICI compensation to determine adapted read thresholds for a target page instead of using fixed ICI compensation may improve the BER and speed of decoding. The read flow 1600 utilizes dynamic estimation for ICI compensation without any additional latency overhead compared to the read flow 1400 in FIG. 14.

The read flow 1600 is different from the read flow 1500 because the read flow 1500 groups ICI states into effective ICI states and determines an effective shift per ICI state. In contrast, the read flow 1600 does not group ICI states. Accordingly, the accuracy of the read flow 1600 is improved from that of the accuracy of the read flow in 1500 because the read flow 1600 models the total ICI states instead of an average, effective ICI state.

Block 1602 may be similar to block 1502 in FIG. 15. In block 1602, soft sampling is performed and combined with ICI sampling. In an example, five-bit resolution soft sampling is performed around thresholds (e.g., QT thresholds estimated from the read flow 600 of dynamic ICI compensation for hard bit decoding in from block 606 in FIG. 6). In some configurations, the number of reads performed for soft sampling may be 31.

Block 1604 may be similar to block 1504. In block 1604, a group read may be performed. The group info reads may be used to distinguish between cells around each target threshold. For example, three state reads may be performed to separate lobe regions of the histograms. In an example, a TLC NAND may use three single state reads to separate four thresholds (e.g., FIG. 2).

In block 1606, ICI reads and re-labeling may be performed. For example, three reads of a next word line and three reads of a previous word line may be used to determine 16 ICI states. A relabeling operation may map the six reads into four bits of 16-ICI states, utilizing all of the available ICI information. Histograms may be computed for each ICI state from the ICI states per cell and the soft samples.

In block 1608, a polynomial coefficient vector may be estimated (e.g., using a model function that maps ICI states to a compensation shift). The histograms (determined from block 1606) may be used to compute the compensation shift as a function of the ordered ICI states for each ICI state and threshold.

In block 1610, labeling may be performed such that the estimated threshold shifts are applied to each ICI state. The labeling operation may result in soft labels determined after ICI compensation.

In block 1612, PST may be performed. In some arrangements, after ICI compensation, the soft decoding labels may be updated and the hard decoding decision thresholds may be adjusted for each group.

Block 1614 may be similar to block 1510 in FIG. 15. In block 1614, soft bit decoding may be performed. For example, a soft decoder (e.g., ECC decoder 112 of FIG. 1) may be used for decoding. In block 1616, it may be determined whether the soft decoding of the target page succeeded. If the soft decoding succeeded, the process may end at block 1611. If the soft decoding failed, the process may proceed to 1618.

Block 1618 may be similar to block 1514 in FIG. 15. In block 1618, the soft labels may be updated. For example LLR mapping (or dynamic LLR estimation) may be performed on the soft labels.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for dynamically estimating interference compensation thresholds of a page of memory comprising:
   computing a histogram and a corresponding threshold based on a plurality of interference states of an interference source;
   clustering the plurality of interference states to determine an effective number of interference states; and
   estimating a read threshold to dynamically compensate an interference noise associated with each interference state of the effective number of interference states of the target row based on the histogram.

2. The method according to claim 1, further comprising identifying a stress condition based on the histogram, wherein the stress condition is at least one of a retention stress or a cross-temperature stress.

3. The method according to claim 2, wherein identifying the stress condition based on the histogram comprises applying the histogram to a support vector machine trained using a training dataset comprising a plurality of interference states of a target row, a feature and a corresponding stress condition, wherein the feature comprises at least one of a physical row number, a program cycle count, an erase cycle count, or a no-inter cell interference threshold.

4. The method according to claim 2, wherein identifying the stress condition based on the histogram comprises applying the histogram to a machine learning model trained using a training dataset comprising a plurality of interference states of a target row, a feature and a corresponding stress condition, wherein the feature comprises at least one of a physical row number, a program cycle count, an erase cycle count, or a no-inter cell interference threshold.

5. The method according to claim 1, wherein clustering the plurality of interference states to determine the effective number of interference states comprises using k-means clustering.

6. The method according to claim 1, wherein clustering the plurality of interference states to determine the effective number of interference states comprises clustering the plurality of interference states of the interference source based on a similar effect induced on a target row.

7. The method according to claim 1, wherein estimating the read threshold comprises using a linear estimator, wherein a vector of the linear estimator contains the read threshold to dynamically compensate the interference state of the effective number of interference states of the target row, a vector of the linear estimator contains a value of the histogram, and a matrix of the linear estimator contains coefficients.

8. The method according to claim 1, wherein estimating the read threshold comprises using a neural network trained using a training dataset comprising a plurality of interference states of a target row, a second plurality of interference states of a second interference source, a feature and a corresponding read threshold, wherein the feature comprises at least one of a physical row number, a program cycle count, an erase cycle count, and a no-inter cell interference threshold.

9. The method according to claim 1 further comprising:
computing a second histogram and a second corresponding threshold based on a second plurality of interference states of a second interference source;
identifying a second stress condition based on the second histogram;
modeling, using a polynomial, the second plurality of interference to determine a compensation for each interference state of the second plurality of interference states of the second interference source.

10. The method according to claim 9, wherein a coefficient of the polynomial is estimated using a linear estimator, wherein a vector of the linear estimator contains the read threshold to dynamically compensate the interference noise of the second plurality of interference states of the second interference source, a vector of the linear estimator contains a value of the second histogram, and a matrix of the linear estimator contains coefficients.

11. The method according to claim 9, wherein a coefficient of the polynomial is estimated using a neural network trained on a training dataset comprising a third plurality of interference states of a third target row, a third plurality of interference states of a third interference source, a feature, and a corresponding polynomial coefficient, wherein the feature comprises at least one of a stress classification score, a physical row number, a program cycle count, an erase cycle count, and a no-inter cell interference threshold.

12. The method according to claim 1, further comprising:
computing a second histogram and a second corresponding threshold based on a second plurality of interference states of a second interference source;
determining, based on the second histogram, that the second interference source is not associated with a second stress condition; and
applying a predetermined threshold to compensate for an interference noise of the target row.

13. The method according to claim 1, wherein the read threshold is offset by a unique voltage from an ideal read threshold.

14. A memory system comprising:
a page of memory having a plurality of rows; and
a circuit for performing operation of the page of memory, the circuit being configured to:
compute a histogram and a corresponding threshold based on a plurality of interference states of an interference source; and
cluster the plurality of interference states to determine an effective number of interference states,
wherein the circuit includes a linear estimator configured to estimate a read threshold to dynamically compensate for an interference noise associated with each interference state of the effective number of interference states of the target row based on the histogram.

15. The memory system of claim 13, further comprising identifying a stress condition based on the histogram, wherein identifying the stress condition comprises applying the histogram to a support vector machine trained using a training dataset comprising a plurality of interference states of a target row, a feature and a corresponding stress condition, wherein the feature comprises at least one of a physical row number, a program cycle count, an erase cycle count, or a no-inter cell interference threshold.

16. The memory system of claim 13, further comprising identifying a stress condition based on the histogram, wherein identifying the stress condition comprises applying the histogram to a machine learning model trained using a training dataset comprising a plurality of interference states of a target row, a feature and a corresponding stress condition, wherein the feature comprises at least one of a physical row number, a program cycle count, an erase cycle count, or a no-inter cell interference threshold.

17. The memory system of claim 13, wherein clustering the plurality of interference states to determine the effective number of interference states comprises using k-means clustering.

18. The memory system of claim 13, wherein clustering the plurality of interference states to determine the effective number of interference states comprises clustering the plurality of interference states of the interference source based on a similar effect induced on a target row.

19. The memory system of claim 13, wherein a vector of the linear estimator contains the read threshold to dynamically compensate the interference state of the effective number of interference states of the target row, a vector of the linear estimator contains a value of the histogram, and a matrix of the linear estimator contains coefficients.

20. A non-transitory processor-readable medium containing processor-readable instructions, such that, when executed by one or more processors, performs a method for dynamically estimating interference compensation thresholds of a page of memory by:
  computing a histogram and a corresponding threshold based on a plurality of interference states of an interference source;
  clustering the plurality of interference states to determine an effective number of interference states; and
  estimating a read threshold to dynamically compensate an interference noise associated with each interference state of the effective number of interference states of the target row based on the histogram.

* * * * *